(12) United States Patent
Sakano et al.

(10) Patent No.: US 6,960,878 B2
(45) Date of Patent: Nov. 1, 2005

(54) LIGHT EMITTING DIODE, OPTICAL SEMICONDUCTOR ELEMENT AND EPOXY RESIN COMPOSITION SUITABLE FOR OPTICAL SEMICONDUCTOR ELEMENT AND PRODUCTION METHODS THEREFOR

(75) Inventors: Kensho Sakano, Anan (JP); Kazuhiko Sakai, Anan (JP); Yuji Okada, Anan (JP); Toshihiko Umezu, Anan (JP)

(73) Assignee: Nichia Corporation, Tokushima (JP)

( * ) Notice: Subject to any disclaimer, the term of this patent is extended or adjusted under 35 U.S.C. 154(b) by 354 days.

(21) Appl. No.: 10/204,192

(22) PCT Filed: Jan. 24, 2002

(86) PCT No.: PCT/JP02/00484

§ 371 (c)(1),
(2), (4) Date: Sep. 11, 2002

(87) PCT Pub. No.: WO02/059982

PCT Pub. Date: Aug. 1, 2002

(65) Prior Publication Data

US 2003/0080341 A1 May 1, 2003

(30) Foreign Application Priority Data

| Jan. 24, 2001 | (JP) | ......................................... | 2001-16367 |
| Jan. 31, 2001 | (JP) | ......................................... | 2001-24794 |
| Feb. 21, 2001 | (JP) | ......................................... | 2001-45659 |
| Mar. 19, 2001 | (JP) | ......................................... | 2001-78322 |
| Mar. 30, 2001 | (JP) | ......................................... | 2001-101924 |
| Sep. 28, 2001 | (JP) | ......................................... | 2001-301833 |
| Sep. 28, 2001 | (JP) | ......................................... | 2001-302390 |
| Oct. 2, 2001 | (JP) | ......................................... | 2001-306707 |

(51) Int. Cl.$^7$ ............................................. H05B 33/00
(52) U.S. Cl. ............................. 313/512; 257/10; 438/20
(58) Field of Search .......................... 313/512; 438/20; 257/10

(56) References Cited

U.S. PATENT DOCUMENTS

| 5,360,578 A | 11/1994 | Leblans et al. |
| 5,998,925 A | 12/1999 | Shimizu et al. |
| 2001/0008484 A1 | 7/2001 | Kato et al. |

FOREIGN PATENT DOCUMENTS

| EP | 0 936 682 B1 | 5/1997 |
| JP | 59-054277 | 3/1984 |
| JP | 1-270282 | 10/1989 |
| JP | 3-166221 | 7/1991 |
| JP | 5-226700 | 9/1993 |
| JP | 7-3258 | 9/1994 |
| JP | 7-106638 | 4/1995 |
| JP | 9-255950 | 9/1997 |
| JP | 10-45879 | 2/1998 |
| JP | 10-215004 | 8/1998 |
| JP | 11-74410 | 3/1999 |
| JP | 2000-31532 | 1/2000 |
| JP | 2000-031532 | 1/2000 |

(Continued)

*Primary Examiner*—Joseph Williams
(74) *Attorney, Agent, or Firm*—Morrison & Foerster LLP

(57) ABSTRACT

A light emitting diode comprising an LED chip having a light emitting layer made of a nitride compound semiconductor and a light transmitting resin that includes a fluorescent material which absorbs at least a part of light emitted by the LED chip and emits light of a different wavelength, wherein the fluorescent material includes a fluorescent particles of small particle size and a fluorescent particles of large particle size, the fluorescent particles of large particle size being distributed in the vicinity of the LED chip in the light transmitting resin to form a wavelength converting layer, the fluorescent particles of small particle size being distributed on the outside of the wavelength converting layer in the light transmitting resin.

9 Claims, 13 Drawing Sheets

FOREIGN PATENT DOCUMENTS

| | | |
|---|---|---|
| JP | 2000-196151 | 7/2000 |
| JP | 2000-223750 | 8/2000 |
| JP | 2000-230038 | 8/2000 |
| JP | 2000-286455 | 10/2000 |
| JP | 2001-019742 | 1/2001 |
| JP | 2001-196642 | 7/2001 |
| JP | 2001-318604 | 11/2001 |
| JP | 2001-342240 | 12/2001 |
| JP | 2002-069155 | 3/2002 |
| JP | 2002-097251 | 4/2002 |
| JP | 2002-100813 | 4/2002 |
| JP | 2002-241586 | 8/2002 |
| WO | WO 97/50132 | 12/1997 |
| WO | WO 98/05078 | 2/1998 |

LIGHT EMITTING DIODE, OPTICAL SEMICONDUCTOR ELEMENT AND EPOXY RESIN COMPOSITION SUITABLE FOR OPTICAL SEMICONDUCTOR ELEMENT AND PRODUCTION METHODS THEREFOR

TECHNICAL FIELD

The present invention relates to an optical semiconductor device such as light emitting diode of mainly surface mounted type that can be used for the back light of a liquid crystal display, full-color display, built-in lamp of a switch, illumination light source, various indicators and traffic lights, and a method for producing the same, and a light transmitting epoxy resin composition that has high light resistance and pliability suitable for the light emitting diode.

BACKGROUND ART

An LED chip that uses a nitride semiconductor ($In_XGa_YAl_{1-X-Y}N$, $0 \leq X \leq 1$, $0 \leq Y \leq 1$), a semiconductor light emitting element capable of emitting blue light with high brightness has recently been developed. Light emitting devices based on nitride semiconductor have such advantages as higher output power than those of light emitting devices that use GaAs, AlInGaP or the like to emit light within a range from red to yellowish green and less color shift caused by temperature change, but has such a drawback that it is difficult to obtain a high output power in a wavelength region including the wavelength of green light and longer. On the other hand, the applicant of the present invention have developed a light emitting diode that is capable of emitting white light by disposing YAG:Ce fluorescent material, a fluorescent material capable of absorbing a part of blue light emitted by the LED chip described above thereby emitting yellow light, on the LED chip and have applied for patent (International Publication No. WO98/5078).

The light emitting diode is, despite the relatively simple constitution of single-chip two-terminal configuration, capable of synthesizing light from the LED chip that is electrically connected to a lead electrode and light from a fluorescent material such as YAG:Ce included in a light transmitting resin that covers the LED chip, and emitting the synthesized white light through a convex lens.

The light emitting diode allows it to modify the synthesized light emitted by the light emitting diode from bluish white to a desired color such as yellowish white by adjusting the content of the fluorescent material. It may also be possible to emit yellow or red light, for example, by adding a pigment.

Meanwhile diversification of the applications for the light emitting diode has generated the needs for a light emitting diode that can emit light with higher luminance.

In recent years, chip light emitting diodes are widely used as the light source for illuminating switch, full-color display, back light for liquid crystal display and the like. The chip light emitting diode is made by electrically connecting a light emitting element in a recess of a package and covering the light emitting element with a light transmitting resin so as to seal the chip.

On the other hand, the rapid advancement in the optical semiconductor technology has been causing a great increase in the output power of the optical semiconductor devices and remarkable decrease in the wavelength of the emitted light. A light emitting diode made of a nitride semiconductor, for example, can emit light with peak intensity at any wavelength within a range from about 350 nm to 650 nm depending on the elements that constitute the light emitting layer. It has also be made possible to emit light with a high output power of 5 mW or over in visible light region of wavelengths not longer than 550 nm (including near ultraviolet and blue-green light) by using multiple quantum well structure in the light emitting layer of a nitride semiconductor. Such a high output power gives rise to a new problem. That is, for a optical semiconductor device that can emit or receive light of such a high energy, it is important to prevent the molding resin from being deteriorated by the light and reduce the stress generated by heat between the molding resin and the optical semiconductor chip.

Japanese Unexamined Patent Publication No. 2000-196151 discloses a molding resin containing, as a main component, an alicyclic epoxy resin instead of bisphenol epoxy resin. An epoxy resin composition obtained by curing the alicyclic epoxy resin, as a main component, with an acid anhydride contains substantially no carbon-carbon double bond, that causes light deterioration, in a main skeleton thereof. As a result, such an epoxy resin composition is less susceptible to deterioration of the molding resin even after being irradiated with light for a long period of time and has relatively good pliability. Thus the semiconductor chip is less likely to be damaged by the thermal stress.

However, epoxy resin cured by acid anhydride cannot be used in a surface mounted device (SMD) that comprises a semiconductor chip mounted directly on the substrate surface, since such a device requires it to form a thin film of the molding resin. That is, the surface mounted device requires a thin film of the molding resin 1 mm or less in thickness formed thereon, the mixture liquid of epoxy resin that is applied has a larger area exposed to the atmosphere. However, since the acid anhydride curing agent has high volatility and high hydroscopicity and takes a relatively longer time, from 5 to 20 hours, to cure, the acid anhydride curing agent absorbs moisture and evaporates during curing, thus making it difficult for the epoxy resin to properly cure. The epoxy resin that has cured unsatisfactorily cannot demonstrate the proper function of resin with the light and heat resistance significantly deteriorated.

For the reason described above, a cation-curing agent such as aromatic sulfonium salt is commonly used instead of the acid anhydride curing agent for such applications that require thin film such as surface mounted device. The cation curing agent allows for satisfactory curing even when a mixture liquid thereof with epoxy resin is applied in a thin film, because of low volatility.

However, since the cation curing agent has an intrinsic tendency to absorb blue light and light having shorter wavelengths, epoxy resin that has been cured by the cation curing agent is liable to discoloration, namely to become yellowish due to absorption of short wavelength light. As a result, it has been difficult to use epoxy resin that is cured by the cation curing agent in a optical semiconductor device that emits or receives blue light and shorter wavelengths. Also because the curing reaction proceeds almost only by the ring-opening reaction of epoxy groups, the epoxy resin composition thus obtained has a three-dimensional network wherein ether bonds are arranged relatively orderly and has lower pliability. Thus there has been such a problem, when epoxy resin that is cured by means of a cation curing agent is used in a optical semiconductor device, that a large stress is generated between the optical semiconductor chip and the molding resin during heating and cooling of the optical semiconductor device, eventually leading to cracks generated in the optical semiconductor chip and wire breakage.

To improve the pliability of epoxy resin composition cured with the cation curing agent, the epoxy resin may be mixed with a low-molecular weight reactive diluent such as monoglycidyl ether, polyglycol glycidyl ether, tertiary carboxyl acid monoglycidyl ether. However, since such a reactive diluent impedes curing of the epoxy resin, it becomes necessary to increase the amount of the cation curing agent added, which aggravates the problem of yellowing of the epoxy resin composition.

DISCLOSURE OF INVENTION

The present invention has been made to meet the various requirements for the light emitting diode made of a nitride semiconductor as described above.

First, an object of the present invention is to provide a wavelength converting light emitting diode that has better light emission characteristic.

Second, an object of the present invention is to provide a method for producing the light emitting diode having good mass-producing performance.

Third, an object of the present invention is to provide an epoxy resin composition that is less susceptible to yellowing and has high pliability while being cured by a cation curing agent, and provide a light emitting diode having excellent light resistance and heat resistance by using such an epoxy resin composition as described above as a molding resin.

In order to achieve the objects described above, a first light emitting diode of the present invention comprises an LED chip having a light emitting layer formed from a nitride compound semiconductor and a light transmitting resin that includes a fluorescent material which absorbs at least a part of light emitted by the LED chip and emits light of a different wavelength.

The fluorescent material includes a fluorescent particles of small particle size and a fluorescent particles of large particle size, with the fluorescent particles of large particle size being distributed in the vicinity of the LED chip in the light transmitting resin thereby to form a wavelength converting layer, and the fluorescent particles of small particle size being distributed on the outside of the wavelength converting layer in the light transmitting resin.

In the first light emitting diode having such a constitution as described above, the wavelength converting layer made of the fluorescent particles of large particle size can change the light color efficiently while the fluorescent particles of small particle size dispersed in an area surrounding thereof suppresses irregular color.

In the first light emitting diode of the present invention, the fluorescent particles of large particle size is preferably prepared by controlling the particle size thereof within a range from 10 to 60 $\mu$m, which makes it possible to distribute the fluorescent particles of large particle size relatively sparsely in the vicinity of the LED chip in the light transmitting resin thereby to have the wavelength converting function performed efficiently.

In the first light emitting diode of the present invention, the fluorescent particles of small particle size is preferably prepared by controlling the particle size thereof within a range from 0.2 to 1.5 $\mu$m, which makes it possible to prevent the fluorescent particles of small particle size from precipitating and have the light scattering function performed effectively, thus suppressing irregular color more effectively.

It is also preferable that the peak diameter of the particle size distribution of the fluorescent particles of large particle size is within a range from 20 to 90 times the peak diameter of the particle size distribution of the fluorescent particles of small particle size, which improves the efficiency of light extraction.

A second light emitting diode of the present invention comprises a light emitting element formed from a semiconductor and a light transmitting resin that includes a fluorescent material which absorbs at least a part of light emitted by the light emitting element and emits light of a different wavelength, wherein the fluorescent material is characterized by a volume-based particle size distribution curve that is flat in a region of cumulative percentage from 0.01 to 10 vol %. This constitution makes it possible to obtain a light emitting diode of high luminance and high output power.

In the second light emitting diode of the present invention, it is preferable that the fluorescent material consists of the fluorescent particles of small particle size and the fluorescent particles of large particle size separated by the flat region described above, while the peak diameter of the particle size distribution of the fluorescent particles of large particle size is within a range from 20 to 90 times the peak diameter of the particle size distribution of the fluorescent particles of small particle size, which results in a light emitting diode having high efficiency of light extraction.

In the first and second light emitting diodes of the present invention, median diameter of the particle size distribution of the fluorescent material is preferably within a range from 15 to 50 $\mu$m, which allows it to improve the efficiency of light emission and achieve a light emitting diode of high luminance. It is also made possible to suppress the formation of dense precipitation that may affect the optical characteristic.

In the first and second light emitting diodes of the present invention, when the distribution frequency of the median diameter of the particle size distribution is in a region from 20 to 50%, light emission of good contrast with suppressed irregular color can be achieved due to less variation in the particle size.

Further in the first and second light emitting diodes of the present invention, it is preferable to include a diffusing agent along with the fluorescent material in the light transmitting resin, which makes it possible to achieve uniform light emission with the irregular color even more suppressed.

Further in the first and second light emitting diodes of the present invention, the light emitting surface of the light transmitting resin is preferably a curved surface. With this configuration, light emitted by the light emitting element is scattered in the interface between the light transmitting resin and the atmospheric air when being extracted through the light transmitting resin to the outside, thus making it possible to suppress the irregular color that tends to occur when the fluorescent particles of large particle size is used. The efficiency of light extraction at the light emitting surface can also be improved thus allowing to emit light with a higher output power.

A third light emitting diode of the present invention has a package that comprises a metal base consisting of a pair of thin metal sheets that constitute positive and negative electrodes being joined via a resin insulator for electrical isolation from each other and a side wall bonded to the circumference of the metal base on one side thereof thereby forming a mounting area, an LED chip mounted on the mounting area and a light transmitting resin that fills the mounting area so as to seal the LED chip.

The light transmitting resin is formed continuously from the mounting area over the top of the surrounding side wall, while the top surface of light transmitting resin is flat and substantially parallel to the metal base and the side face on the circumference of the light transmitting resin is substantially flush with the circumferential side face of the package.

The third light emitting diode having such a constitution as described above makes it possible to provide a light emitting diode that has high reliability and is suited to mass production. Since the light transmitting resin is formed continuously from the mounting area to the top surface of the side wall, the light emitting surface is expanded to the entire top surface of the light emitting diode, thus achieving good beam directivity.

The light transmitting resin may also include a filler, that may be a fluorescent material capable of absorbing a part of light emitted by the light emitting element and emitting light of a different wavelength.

Although adding a fluorescent material tends to cause irregular color, the constitution of the present invention makes a better light emitting surface that suppresses irregular color.

Median diameter of the particle size distribution of the fluorescent material is preferably within a range from 15 to 50 μm, and more preferably within a range from 20 to 50 μm. Using the fluorescent material having such particle sizes allows the wavelength converting function of the fluorescent material to be performed effectively, and dicing process to be carried out satisfactorily thereby improving the yield of production.

A method for producing the light emitting diode according to the present invention is a method for producing the third light emitting diode, comprising a first step of making a package assembly consisting of a plurality of packages by bonding an insulating substrate having a plurality of through holes that are grouped corresponding to the mounting areas, and a metal base plate having portions separated by the resin insulator in correspondence to the through holes; a second step of mounting the LED chip in the mounting area of each package formed with the through hole; a third step of applying and curing the light transmitting resin on the top surface of the insulating substrate and in the through holes by mimeograph printing by using a mask that has an aperture in correspondence to each group; and a fourth step of dividing the package assembly having the light transmitting resin applied thereon into individual packages.

This constitution makes it possible to satisfactorily mass-produce the light emitting diodes that have uniform thickness and flat light emitting surface and end surface.

According to the producing method of the present invention, the mimeograph printing is preferably carried out while repeating the cycle of decreasing and increasing the pressure. This makes it very easy to remove bubbles so that the light emitting diodes that have less variations in the characteristics, less unevenness in light emission and less irregular color can be manufactured.

In case the light transmitting resin contains inorganic fillers, in particular, air tends to be entrapped in the resin so as to form bubbles therein during mixing. Also the optical path length becomes longer which also tends to cause irregular color due to a difference in the specific gravity between the fillers and between the filler and the light transmitting resin, but the irregular color can be suppressed by the producing method of the present invention. Thus the light emitting diodes having variations in the light color and high reliability can be manufactured.

The epoxy resin composition of the present invention comprises an epoxy resin containing an alicyclic epoxy resin, which accounts for 65% by weight or more of the epoxy resin, an acid anhydride represented by the general formula (1) or dicarboxylic acid represented by the general formula (2) in an amount of 0.005 to 1.5 mol based on an epoxy equivalent of the epoxy resin, and a cation curing agent in an amount of 0.005 to 1.5 mol based on an epoxy equivalent of the epoxy resin.

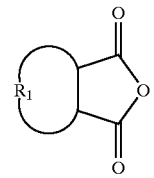

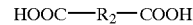

wherein $R_1$ represents a cyclic or aliphatic alkyl or aryl having 0 to 12 carbon atoms and $R_2$ represents an alkyl or aryl having 0 to 12 carbon atoms.

The epoxy resin composition of the present invention can be cured by using the cation curing agent in the amount 1/10 to 1/100 times as much as that in the prior art because the alicyclic epoxy resin reacts with the acid anhydride or dicarboxylic acid (hereinafter referred to as an acid anhydride or the like) to form a crosslinked oligomer having some polymerization degree. Therefore, absorption of light having a short wavelength caused by the cationic curing agent is inhibited, thus making it possible to prevent yellowing of the resulting epoxy resin composition. The epoxy resin composition of the present invention has not only an ether bond due to the ring-opening reaction of epoxy groups, but also an ester bond due to the crosslinking reaction between the alicyclic epoxy resin and the acid anhydride or the like so that it has a three-dimensional network formed by irregular connection of epoxy resins. Therefore, the epoxy resin composition has high pliability even if a reactive diluent is not used and the use of the epoxy resin composition in a molding resin of an optical semiconductor device reduces the thermal stress produced between an optical semiconductor chip and a molding resin, thus making it possible to prevent problems such as crack and wire breakage.

The pliability of the epoxy resin composition obtained by the reaction between the epoxy resin and the acid anhydride or the like tends to be proportion to the molecular weight of the crosslinked oligomer. The higher the proportion of carboxyl groups, which are converted into an ester as a result of the reaction with the epoxy resin or a promotor described hereinafter, among carboxyl groups of the acid anhydride or the like in the crosslinked oligomer, the better the pliability of the resulting epoxy resin composition. The reason is considered as follows. As the ester conversion proceeds, volatilization of the acid anhydride in the thin film is less likely to occur in case of curing. The ester conversion ratio of carboxyl groups of the acid anhydride or the like in the crosslinked oligomer is 10% or more, and preferably 70% or more. The ester conversion ratio can be controlled by the reaction temperature and time.

The epoxy resin composition of the present invention has an advantage that, after reacting an alicyclic epoxy resin and an acid anhydride or dicarboxylic acid to obtain a crosslinked oligomer, a mixture of the crosslinked oligomer and the cation curing agent can be cured. When the alicyclic epoxy resin and acid anhydride or the like are previously reacted in a proper reaction vessel to form a crosslinked oligomer and a mixture of the crosslinked copolymer and a cation curing agent is molded over the surface of a substrate of an optical semiconductor device, volatilization of the acid anhydride can be prevented during the curing reaction even in case of molding in the form of a thin film. Since the viscosity of the mixture of the crosslinked copolymer and the cation curing agent can be freely controlled by the amount of the acid anhydride or the like and the ester conversion ratio, the viscosity suited for handling can be easily set. The mixture of the crosslinked copolymer and the cation curing agent has already been polymerized to some degree, thus resulting in less change in viscosity with a lapse of time and long pot life.

When using the epoxy resin composition of the present invention in a molding resin of an optical semiconductor device, functional particles such as fillers, fluorescent agent particles, diffusing agent particles and colorant agent particles can be appropriately mixed. Since the mixed solution of the crosslinked copolymer and the cation curing agent has a comparatively high viscosity, these functional particles are superior in dispersibility. Therefore, a desired function can be exhibited in a small content of the particles, thereby making it possible to reduce a loss in light emission or light reception of the optical semiconductor device due to light scattering and screening of the functional particles.

As the alicyclic epoxy resin in the epoxy resin composition of the present invention, for example, epoxidated cyclohexene derivative, hydrated hisphenol A diglycidyl ether and diglycidyl hexahydrophthalate ester are preferably used. The use of the alicyclic epoxy resin makes it possible to obtain an epoxy resin composition which is less likely to cause light deterioration and is superior in pliability.

As the cation curing agent in the epoxy resin composition of the present invention, for example, aromatic sulfonium salt, aromatic diazonium salt, aromatic iodonium salt and aromatic selenium salt can be preferably used. These cation curing agents can achieve sufficient curing in a small amount because of its fast curing rate.

Preferably, the epoxy resin composition of the present invention further contains a polyhydric alcohol or a polycondensate thereof in the amount of 0.1 to 5.0 equivalents based on the acid anhydride or dicarboxylic acid. Examples of the usable polyhydric alcohol include ethylene glycol, diethylene glycol, trimethylene glycol, triethylene glycol, propylene glycol, 1,4-butanediol, and 1,6-hexanediol. The pliability of the resulting epoxy resin composition can be further improved by adding these polyhydric alcohol or polycondensates thereof.

An optical semiconductor device of the present invention comprises at least a pair of lead electrodes, an optical semiconductor chip that is electrically connected to the lead electrodes and a molding resin that seals the optical semiconductor chip, wherein the epoxy resin composition of the present invention is used as the molding resin. This constitution makes it possible to manufacture the light emitting diode that is subject to less decrease in the light emission or reception efficiency due to yellowing of the molding resin and is less susceptible to damage to the chip due to thermal cycle and to wire breakage.

The effects of improving the light resistance and the heat resistance can be achieved remarkably particularly in case the optical semiconductor device of the present invention is of the surface mounted type made by joining the optical semiconductor chip on the surface of a substrate having lead electrodes formed thereon, or a light emitting diode chip comprising an optical semiconductor that has a light emitting layer made of a nitride semiconductor that includes at least In and Ga and a main peak of emission at a wavelength of 550 nm or shorter.

A first method for producing the fluorescent particles of the present invention is a method for producing the fluorescent material by firing a mixture of a stock material and a flux, wherein the firing process includes a first firing process of firing in a first reducing atmosphere and a second firing process of firing in a second reducing atmosphere, while the first reducing atmosphere has weaker reducing power than the second reducing atmosphere.

The fluorescent material that can absorb the excitation light more efficiently by producing the fluorescent material by this method.

In the first method for producing the fluorescent material of the present invention, aluminum fluoride can be used as the flux.

In the first method for producing the fluorescent material of the present invention, a substance including barium fluoride and boric acid can be used as the flux in which case it is preferable that the flux includes a liquid.

When a substance including barium fluoride and boric acid with a liquid added, thereto is used as the flux, variation in the chromaticity of the emitted light can be suppressed.

A second method for producing the fluorescent material of the present invention is a method for producing the fluorescent material by firing a mixture of a stock material and a flux, wherein the flux includes barium fluoride, boric acid and a liquid.

This method can suppress the variation in the chromaticity of the light emitted from the fluorescent material manufactured thereby.

According to the producing method, water can be used as the liquid.

According to the producing method, $Y_2O_3$, $Gd_2O_3$, $Al_2O_3$ and $CeO_2$ can be used.

BRIEF DESCRIPTION OF DRAWINGS

FIG. 15 is a graph showing the variation in the viscosity of epoxy resin composition with time.

BEST MODE FOR CARRYING OUT THE INVENTION

Now preferred embodiments of the present invention will be described below with reference to the accompanying drawings.

Embodiment 1

Figure 1:
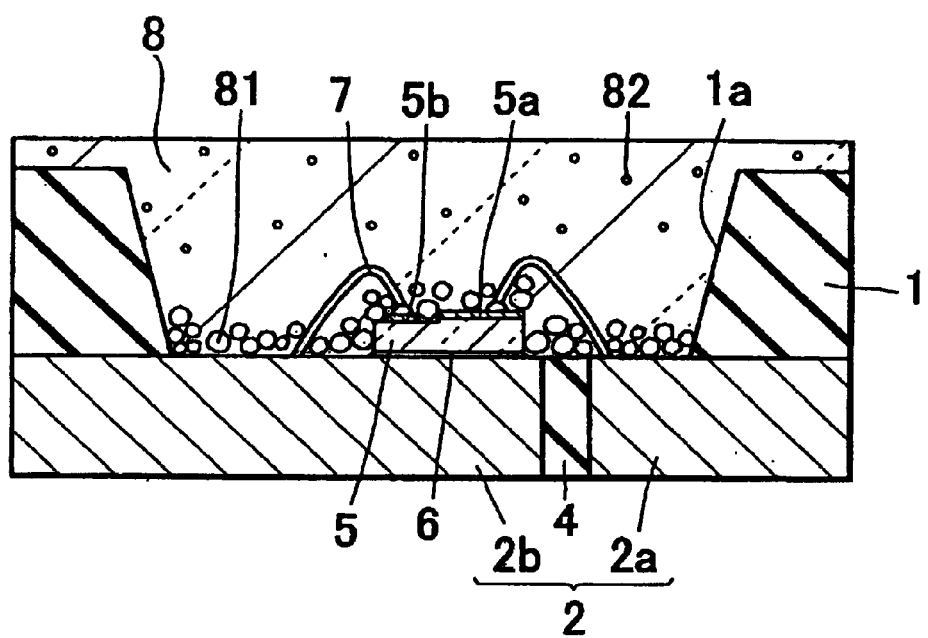
FIG. 1 is a schematic sectional view of an SMD type light emitting diode according to first embodiment of the present invention.

A light emitting diode of the first embodiment is of surface mounted type (SMD) comprising a light emitting diode chip (LED chip) 5 sealed in a package with a light transmitting resin 8 as shown in FIG. 1. In the light emitting diode of the first embodiment, the package comprises a metal base 2 and a side wall 1, the side wall 1 being bonded with the circumference on one side of the metal base 2 for making a mounting area 1a. The LED chip 5 is die-bonded in the mounting area 1a of the package and is, after wiring is made by wire bonding, sealed with the light transmitting resin 8 (for example, about 1 mm thick over the LED chip).

In the light emitting diode of the present invention, the epoxy resin proprietary to the present application is used as the sealing resin 8, and the sealing resin includes a fluorescent material (fluorescent material particles) dispersed therein that converts the light emitted by the light emitting diode (LED) chip into light of different wavelength and emits this light, thus providing the following features.

First, light resistance and heat resistance are improved by using the light transmitting sealing resin 8 comprising the epoxy resin composition that can be cured with a smaller amount of the cation curing agent because crosslinked oligomer is formed through the reaction of alicyclic epoxy resin and acid anhydride or dicarboxylic acid.

Second, output power and luminance of light emission are greatly improved by controlling the particle sizes of the fluorescent material (wavelength converting substance) that is dispersed in the light transmitting resin in the specific particle size distribution of the present invention.

Now the constitution the light emitting diode of the first embodiment will be described in detail below.

<Package>

According to this embodiment, the metal base 2 of the package is made of a thin metal sheet 2a constituting a positive terminal and a thin metal sheet 2b constituting a negative terminal that are bonded to each other with an insulating resin 4 and connected to a positive electrode 5a and a negative electrode 5b of the LED chip 5, respectively, with wires 7.

In the first embodiment, the LED chip 5 is die-bonded with a die bonding resin 6 onto the thin metal film 2b. According to the present invention, however, the LED chip 5 may also be die-bonded onto the other thin metal film 2a, or over both the thin metal film 2a and the thin metal film 2b.

<LED chip 5>

Since the light emitting diode of the first embodiment is constituted so as to convert the wavelength of a part or all of the light emitted by the LED chip 5, the LED chip 5 is made in such a constitution that emits light of wavelength that can excite the fluorescent material. While various semiconductors such as ZnSe and GaN can be used for the LED chip 5, according to the present invention the LED chip 5 preferably uses a nitride semiconductor ($In_XAl_YGa_{1-X-Y}N$, $0 \leq X$, $0 \leq Y$, $X+Y \leq 1$) capable of emitting light of short wavelength that can efficiently excite the fluorescent material. The LED chip 5 has the light emitting layer made of $In_XGa_{1-X}N$ (0<X<1), wherein wavelength of the emitted light can be changed within a range from about 365 nm to 650 nm by changing the mixed crystal composition. While the LED chip 5 may be constituted in either homojunction structure, heterojunction structure or double heterojunction structure that has MIS junction, PIN junction or pn junction according to the present invention, it is preferable to employ double heterojunction structure that allows light emission with higher luminance. Wide selection of the wavelengths of light emission is made possible by controlling the chemical composition and mixed crystal composition of the semiconductor that constitutes the light emission layer (active layer). The active layer may also be made either in single quantum well structure or multiple quantum well structure including a thin film that includes quantum effect.

When the LED chip 5 uses a nitride semiconductor, sapphire, spinel, SiC, Si, ZnO or the like can be used for the substrate, but it is preferable to use a sapphire substrate in order to form the nitride semiconductor of good crystallinity satisfactorily in mass production. The nitride semiconductor can be formed on the sapphire substrate by MOCVD process or the like. It is preferable to form a buffer layer such as GaN, AlN or GaAlN on the sapphire substrate and form the nitride semiconductor layer having pn junction thereon.

The LED chip having pn junction made of nitride semiconductor may be made in double heterojunction structure by forming the buffer layer on the sapphire substrate and forming, on the buffer layer, a first contact layer of n-type gallium nitride, a first cladding layer of n-type aluminum gallium nitride, an active layer of indium gallium nitride, a second cladding layer of p-type aluminum gallium nitride and a second contact layer of p-type gallium nitride successively in the order.

While the nitride semiconductor shows n-type conductivity when not doped with an impurity, Si, Ge, Se, Te, C or the like is preferably introduced as an n-type dopant in order to form the desired n-type nitride semiconductor and Zn, Mg, Be, Ca, Sr, Ba or the like is preferably added as a p-type dopant in order to form the p-type nitride semiconductor.

Since it is difficult to turn the nitride semiconductor into p-type simply by doping with a p-type dopant, it is preferable to decrease resistance by heating in a furnace, by plasma irradiation or the like after introducing the p-type dopant. Thus the LED chip 5 using the nitride semiconductor can be manufactured by forming the nitride semiconductor layers and then cutting a wafer having electrodes formed at predetermined positions into individual chips.

In order to have the light emitting diode of the first embodiment emit white light, it is preferable to set the wavelength of light emitted by the LED chip 5 within a range from 400 nm to 530 nm in consideration of the relationship of complementary color with the light emitted by the fluorescent material and the need to prevent the light transmitting resin from being deteriorating, and the wavelength is more preferably set within a range from 420 nm to 490 nm. In order to improve the efficiency of emitting light of the LED chip itself and the efficiency of emitting light by the excitation of the fluorescent material, it is more preferable to set the wavelength of light emitted by the LED chip 5 within a range from 450 nm to 475 nm. The present invention can also be applied to an LED chip that emits light in ultraviolet region of a wavelength shorter than 400 nm, by choosing the type of fluorescent material.

Since the nitride semiconductor LED chip based on the insulating substrate such as sapphire or spinel has the p-type and n-type electrodes formed on the semiconductor surface side, the electrodes are formed in a desired shape on the p-type semiconductor layer and the n-type semiconductor layer by sputtering, vapor deposition or the like after etching the p-type semiconductor so as to expose the n-type semiconductor. When light is extracted from the semiconductor side, the electrode formed almost all over the surface of the p-type semiconductor layer is made as a light transmitting electrode consisting of a thin metal film.

<Fluorescent Substance>

Specific gravity of the fluorescent material is several time that of the liquid resin before curing. Viscosity of a thermosetting resin decreases considerably when heated to cure. As a result, when a liquid resin including a fluorescent material is applied to cover an LED chip and is heated to cure, most of the fluorescent material included in the resin is concentrated around the LED chip and sediment.

Since the concentrated particles of the fluorescent material sediment one on another around the LED chip 5, only the fluorescent material particles located near the LED chip surface can efficiently absorb light emitted by the LED chip. Thus many of the fluorescent material particles do not fully perform the wavelength converting function but act only to attenuate the light energy by blocking the light of which wavelength has been converted by the other fluorescent material particles. This results in a decrease in the output power of the light emitting diode.

To avoid such a problem, the present invention employs such a fluorescent material having a particular particle size distribution as the wavelength converting function of all fluorescent material particles can be fully made use of, thereby to improve the output power of the light emitting diode.

Figure 2A:
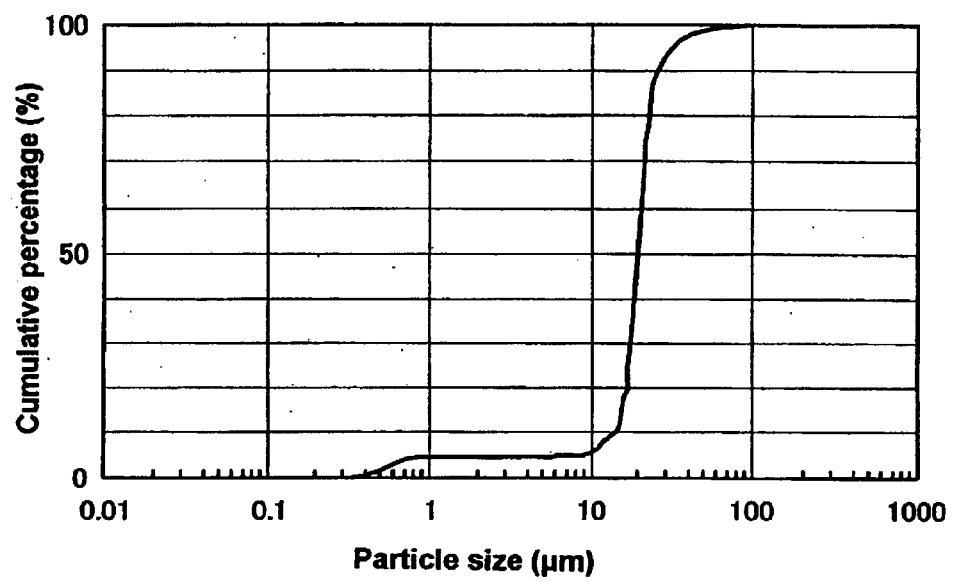
FIG. 2A is a graph showing the volume-based distribution curve (cumulative percentage of particle sizes) of the fluorescent material of the first embodiment.
Figure 2B:
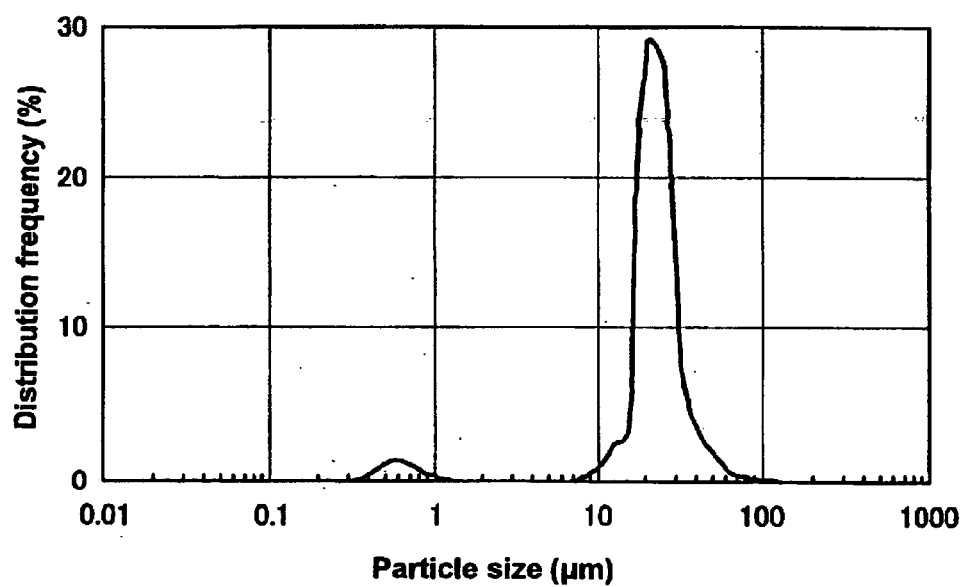
FIG. 2B is a graph showing the volume-based distribution curve (distribution frequency of particle sizes) of the fluorescent material of the first embodiment.

Specifically, the fluorescent material used in the light emitting diode of the first embodiment consists of a group of fluorescent particles of large particle size 81 (first part of distribution) and a group of fluorescent particles of small particle size 82 (second part of distribution), while there is a region between the first part and the second part of the particle size distribution where substantially no fluorescent material exists. According to the present invention, the fluorescent material of such a particle size distribution is used to prevent the formation of precipitation that has adverse effect on the optical performance and prevent irregular color of the emitted light from occurring. FIG. 2A and FIG. 2B show volume-based distribution curve of the fluorescent material used in the first embodiment, FIG. 2A being the cumulative percentage distribution of the particle sizes and FIG. 2B being distribution frequency of the particle sizes.

As shown in FIG. 2A, the fluorescent material used in the present invention consists of particles of sizes distributed as shown by the volume-based distribution curve that has a flat region between the cumulative percentage of 0.01 vol % to 10 vol % where inclination of the curve is zero. In the flat region, that is a range of particle sizes located between the first part and the second part of the distribution, there is substantially no fluorescent material.

In the first embodiment, the fluorescent particles of small particle size 82 accounts for 0.01 vol % to 10 vol % of the total volume of fluorescent material, while the fluorescent particles of large particle size 81 accounts for 90 vol % or more of the total volume of fluorescent material. According to the present invention, the fluorescent particles of small particle size preferably accounts for 0.01 vol % to 5 vol % of the total volume of fluorescent material. Including the fluorescent particles of small particle size in such a small amount makes it possible to disperse the fluorescent material in the resin so as not to block the light emitted by the LED chip and the fluorescent particles of large particle size while preventing irregular color from occurring.

It is also preferable that the peak diameter of the particle size distribution of the fluorescent particles of large particle size 81 is within a range from 20 to 90 times the peak diameter of the particle size distribution of the fluorescent particles of small particle size 82. When the two groups of particles have such a large difference in particle size, it is made possible to make full use of the functions of the two groups of fluorescent material particles (the fluorescent particles of small particle size 82 mainly scatter light, and the fluorescent particles of large particle size 81 mainly convert the wavelength).

The fluorescent particles of small particle size 82 has lower efficiency of wavelength conversion, but can reflect and scatter light thereby preventing irregular color of the emitted light. Therefore, the fluorescent particles of small particle size is preferably dispersed in the light transmitting resin instead of precipitating around the LED chip.

The fluorescent particles of small particle size used in the present invention are prepared in a very small amount with the particle sizes thereof being far smaller than those of the fluorescent particles of large particle size. This allows for the light emitting diode having the fluorescent particles of small particle size favorably dispersed in the light transmitting resin. Particle sizes of the fluorescent particles of small particle size 82 are preferably within a range from 0.2 to 1.5 $\mu$m. This makes it possible to prevent the fluorescent particles of small particle size from precipitating and have the function to scatter light performed effectively. Also the fluorescent particles of small particle size 82 of particle sizes described above hardly precipitate in the light transmitting resin that has not yet cured, and therefore can be disposed separately from the fluorescent particles of large particle size 81. Specifically, the fluorescent material of the present invention consisting of the fluorescent particles of large particle size 81 and the fluorescent particles of small particle size 82 exists in such a state in the light transmitting resin that covers the LED chip 5 as the fluorescent particles of large particle size 81 are located near the LED chip 5 and the fluorescent particles of small particle size 82 are dispersed substantially uniformly in the surrounding thereof. Of the fluorescent material dispersed in this state, the fluorescent particles of large particle size 81 function to convert the wavelength of the light emitted by the LED chip 5 and the fluorescent particles of small particle size 82 located in the surrounding thereof work to reflect the light thereby to prevent irregular color of the emitted light.

The fluorescent material of medium particle size may also be included that have a peak of particle size distribution at a particle size between those of the fluorescent particles of small particle size 82 and the fluorescent particles of large particle size 81. It is difficult for the fluorescent particles of large particle size to absorb and convert all the light to be converted. The fluorescent particles of large particle size 81 has a larger surface area and therefore there is some portion of light that is reflected by large fluorescent material particles. To counter this difficulty, such fluorescent particles of medium particle size are included along with the fluorescent particles of large particle size 81 that have particle sizes smaller than those of the fluorescent particles of large particle size 81 and smaller than those of the fluorescent particles of small particle size 82, so that part of light that is not absorbed by the fluorescent particles of large particle size 81 is absorbed by the fluorescent particles of medium particle size and converted to different color. Through efficient color conversion of the portion of light emitted by the LED chip and reflected by the surfaces of the fluorescent particles of large particle size as described above, it is made possible to obtain desired chromaticity with a minimum amount of fluorescent material and improve the luminance. The median particle size of the fluorescent particles of medium particle size is preferably within a range from 0.3 to 0.9 times that of the fluorescent particles of large particle size 81, more preferably 0.5 to 0.8 times thereof, which makes it possible to efficiently absorb light reflected on the surface of the fluorescent particles of large particle size and convert the color thereof.

In general, the efficiency of converting wavelength of light becomes higher as the particle size of the fluorescent material is larger. The light emitting diode of the present invention is made in such a constitution as all light emitted by the LED chip 5 is efficiently absorbed and converted by the fluorescent particles of large particle size 81, by designing the particle size distribution of the fluorescent particles of large particle size 81 as described later so that the fluorescent particles of large particle size 81 will not be disposed one on another around the LED chip 5.

Figure 4A:
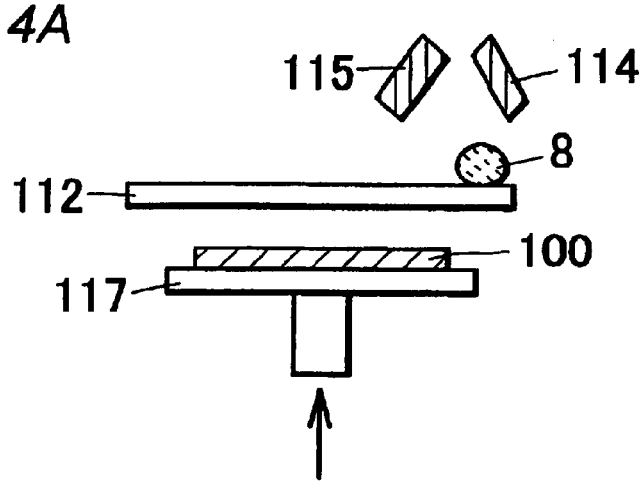
FIG. 4A through FIG. 4D are process diagrams of the mimeograph printing in the producing method of the first embodiment.
Figure 4B:
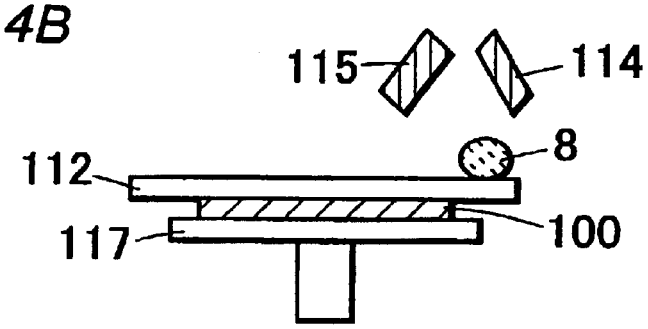

Since the fluorescent particles of large particle size 81 having larger particle sizes among the fluorescent material particles of the present invention are distributed as shown in FIG. 4A and FIG. 4B, the particles hardly precipitate in such a state as the particles are in contact with each other, but are precipitated while keeping favorable distances from each other. As a result, light emitted by the LED chip 5 can be guided not only to the fluorescent particles of large particle size 81 that are located near to the LED chip 5 but also to all the fluorescent particles of large particle size 81. Consequently, more fluorescent material particles can contribute to the conversion of light thereby increasing the light absorption efficiency and wavelength conversion efficiency of the entire fluorescent material.

In order to obtain desired light by using the fluorescent material of the prior art of which particle sizes are not properly controlled, it is necessary to include a large amount of the fluorescent material in the resin. Since this leads to thicker layer of fluorescent material with the particles piled up one on another, proportion of the fluorescent material particles that do not contribute to the light conversion increases and the fluorescent material particles that do not contribute to the light conversion block the light. Thus light extraction ratio has been low and high luminance could not be achieved with the fluorescent material of the prior art. When the fluorescent particles of large particle size 81 having the mean particle size and the particle size distribution properly controlled are used as in the present invention, probability of the fluorescent particles of large particle size 81 to precipitate densely one on another is low so that the fluorescent particles of large particle size 81 can be dispersed more sparsely than in the prior art. Accordingly, because the distance between each fluorescent material particle and the light emitting surface can be made relatively shorter, light of which wavelength has been converted can be extracted to the outside while maintaining high luminance without being absorbed by the resin.

Basic concept of controlling the particle distribution of the fluorescent particles of large particle size 81 according to the present invention has been described above.

According to the present invention, as described above, the light emitting diode of high luminance and high output power can be achieved by using the fluorescent material consisting of the fluorescent particles of large particle size 81 and the fluorescent particles of small particle size 82 and making the color conversion layer made from the fluorescent particles of large particle size 81 disposed around the LED chip 5 at favorable distances from each other in order to improve the efficiency of extracting the light to the outside, the light absorption ratio and the light conversion efficiency.

In order to fluorescent material particles that do not contribute to the light conversion efficiency, particle sizes of the fluorescent particles of large particle size 81 are preferably controlled within a range from 10 $\mu$m to 60 $\mu$m, more preferably from 10 $\mu$m to 50 $\mu$m and most preferably from 15 $\mu$m to 30 $\mu$m. Fluorescent particles smaller than 10 $\mu$m and larger than the fluorescent particles of small particle size 82 tend to precipitate and precipitate densely mass in the liquid resin, thereby decreasing the transmittance of light. Fluorescent particles smaller than 15 $\mu$m and larger than the fluorescent particles of small particle size 82 have higher tendency to precipitate and precipitate densely in the liquid resin than those larger than 15 $\mu$m and, when the producing process is controlled improperly, the particles precipitate densely in the liquid resin thereby decreasing the transmittance of light.

Particle sizes of the fluorescent particles of large particle size are preferably uniform which makes it possible to effectively prevent the fluorescent particles of large particle size from precipitating densely. Standard deviation of the particle size distribution of the fluorescent particles of large particle size can be kept to within the desirable range of 0.3 or lower without specific classifying operation, and can be further controlled to 0.15 or lower by classification (the inventors of the present application verified that fluorescent particles of large particle size having standard deviation of 0.135 can be manufactured by classification).

The present invention improves the output power of the light emitting diode by using the fluorescent particles of large particle size as described above thereby minimizing the blocking of the light by the fluorescent material. The material for the fluorescent particles of large particle size used in the present invention is preferably one that has high light absorption ratio, high conversion efficiency and a wide range of excitation wavelengths.

As 90 vol % or more of the fluorescent material consists of the fluorescent particles of large particle size 81 that have excellent optical characteristics (high light absorption ratio, high conversion efficiency and a wide range of excitation wavelengths), light of other wavelengths around the main emitting wavelength of the LED chip can be satisfactorily converted to other wavelength and the light emitting diode can be manufactured more preferably in mass production.

As described above, since the light emitting diode of the present invention uses the fluorescent material of the above constitution, the fluorescent material particles can be separated into the layer having the function to scatter light made of the fluorescent particles of small particle size 82 dispersed in the region apart from the LED chip 5 in the resin and the color conversion layer made of the fluorescent particles of large particle size 81 precipitated around the LED chip 5 with favorable distances being kept from each other. Thus the light emitting diode of the present invention capable of emitting light of high output power and high luminance uniformly without irregular color can be obtained.

Particle size distribution of the fluorescent material used in the present invention is shown by the volume-based distribution curve. The volume-based distribution curve is drawn by measuring the particle size distribution of the fluorescent material by laser diffraction and scattering method. Specifically, the fluorescent material is dispersed in a aqueous sodium hexametaphosphate solution having a concentration of 0.05% and the particle size distribution is measured with a laser diffraction particle size distribution measuring instrument (SALD-2000A) over a range from 0.03 to 700 μm in an atmosphere of 25° C. in temperature and 70% in humidity.

According to the present invention, median particle size of the fluorescent material refers to the particle size at which the cumulative percentage reaches 50 vol % in the volume-based distribution curve, and this value is preferably within a range from 15 to 50 μm. It is also preferable that the fluorescent material includes the particles of this median size with a high concentration, preferably from 20% to 50 vol %(distribution frequency). The light emitting diode having good contrast with irregular color suppressed can be obtained by using the fluorescent material made up of particles having less variation in size as described above.

This is because, while the fluorescent particles of large particle size 81 are more probable to cause irregular color than smaller fluorescent material particles, grading the fluorescent particles of large particle size 81 to decrease the variations in the particle size improves the irregular color compared to a case of greater variations.

In the light emitting diode of the present invention, the fluorescent material is preferably based on the yttrium aluminum oxide fluorescent material activated with cerium that can emit light by absorbing the light emitted by the semiconductor LED chip having the light emission layer made of a nitride semiconductor.

The yttrium aluminum oxide fluorescent material may be $YAlO_3$:Ce, $Y_3Al_5O_{12}$:Ce (YAG:Ce), $Y_4Al_2O_9$:Ce or a mixture of these materials. The yttrium aluminum oxide fluorescent material with Ba, Sr, Mg, Ca and/or Zn included therein may also be used. Si may also be included to suppress the reaction of growing crystal so as to obtain the fluorescent material particles of uniform sizes.

In this specification, the yttrium aluminum oxide fluorescent material activated with Ce is to be understood in a broad sense of the word so as to include the following fluorescent materials:

(1) yttrium aluminum oxide fluorescent material with part or all yttrium atoms being substituted with at least one element selected from the group consisting of Lu, Sc, La, Gd and Sm.

(2) yttrium aluminum oxide fluorescent material with part or all aluminum atoms being substituted with at least one element selected from the group consisting of Ba, Tl, Ga and In.

(3) yttrium aluminum oxide fluorescent material with part or all yttrium atoms being substituted with at least one element selected from the group consisting of Lu, Sc, La, Gd and Sm and part or all aluminum atoms being substituted with at least one element selected from the group consisting of Ba, Tl, Ga and In.

More specifically, the fluorescent material is a photoluminescent fluorescent particles represented by general formula $(Y_ZGd_{1-z})_3Al_5O_{12}$:Ce ($0<Z\leq1$) or a photoluminescent fluorescent particles represented by general formula $(Re_{1-a}Sm_a)_3Re'_5O_{12}$:Ce ($0\leq a<1$, $0\leq b\leq 1$, Re is at least one element selected from among Y, Gs, La and Sc and Re' is at least one element selected from among Al, Ga and In).

The fluorescent material, due to its garnet structure, has high resistance against heat, light and water, and has an excitation spectrum peaking at around 450 nm and a broad emission spectrum with peak emission at around 580 nm and tailing up to 700 nm.

Efficiency of excitation emission of the photoluminescent fluorescent particles in a long wavelength region not shorter than 460 nm can be improved by including Gd (gadolinium) in the crystal. As the Gd content is increased, peak wavelength of light emission shifts toward a longer wavelength and the entire emission spectrum also shifts toward longer wavelengths. This means that emission of light of more reddish color can be achieved by increasing the Gd content. Increasing the Gd content also decreases the luminance of blue photoluminescence emission. The fluorescent material may also include Tb, Cu, Ag, Au, Fe, Cr, Nd, Dy, Co, Ni, Ti or Eu added thereto as required.

The emission wavelength also shifts toward shorter wavelengths when a part of Al atoms are substituted with Ga in the yttrium aluminum garnet fluorescent material having a garnet structure. The emission wavelength also shifts toward longer wavelengths when a part of Y atoms are substituted with Gd.

When substituting a part of Y atoms with Gd, it is preferable to keep the proportion of Y atoms substituted with Gd within 10% and increase the Ce content (substitution) from 0.03 to 1.0. When the proportion of Y atoms substituted with Gd is less than 20%, green component increases and red component decreases but this change can be compensated for by increasing the Ce content so as to compensate for the decrease in the red component thereby to obtain the desired chromaticity without decreasing the luminance. Because the photoluminescent fluorescent particles which has such a composition has an excellent temperature characteristic, the reliability of the light emitting diode can be improved. Also the use of a photoluminescent fluorescent particles that has been prepared to have much red component makes it possible to manufacture a light emitting diode capable of emitting an intermediate color such as pink.

The photoluminescent fluorescent particles described above can be manufactured as follows. First, as the materials to make Y, Gd, Al and Ce, oxides thereof or compounds that can easily turn into such oxides are mixed in stoichiometrical proportions thereby to make the stock material. Alternatively, a solution prepared by dissolving rare earth metals of Y, Gd and Ce in stoichiometrical proportions in an acid is coprecipitated with oxalic acid, the product of which is fired to obtain a coprecipitated oxide material. The coprecipitated oxide material is mixed with aluminum oxide to obtain a mixed stock material. A mixture of the mixed stock material and fluoride such as barium fluoride or ammonium fluoride added thereto as a flux is put into a crucible and fired at a temperature from 1350 to 1450° C. in air atmosphere for 2 to 5 hours. The fired material is ground in water by using a ball mill, washed, separated, dried and sieved to obtained a photoluminescent fluorescent particles.

In the light emitting diode of the present invention, the photoluminescent fluorescent particles may contain two or more kinds of yttrium aluminum garnet fluorescent material activated with cerium and/or other fluorescent material added thereto.

When two kinds of yttrium aluminum garnet fluorescent material having different proportions of Y being substituted with Gd are mixed, light of desired chromaticity can be obtained easily. Particularly when a fluorescent material having higher proportion of substitution is used as the fluorescent particles of large particle size and a fluorescent material having lower proportion of substitution or no substitution at all is used as the fluorescent particles of medium particle size, color rendering performance and luminance can be improved at the same time.

<Light Transmitting Resin>

The light transmitting resin 8 is formed by applying a solution, which is prepared by mixing a crosslinked oligomer obtained by reacting an epoxy resin containing an alicyclic epoxy resin, which accounts for 65% by weight or more of the epoxy resin, with an acid anhydride or dicarboxylic acid (0.005 to 1.5 mol based on an epoxy equivalent) with a small amount of a cation curing agent (0.00005 to 0.003 mol, preferably 0.0001 to 0.01 mol, based on an epoxy equivalent), to the inside of a mounting area 1a in which the LED chip 5 of the nitride semiconductor is mounted, followed by curing with heating.

The light transmitting resin 8 thus formed scarcely causes yellowing of the resin because the content of the cation curing agent that absorbs blue light is 1/10 to 1/100 times as much as that in the prior art. Therefore, the light emitted by the LED chip of the nitride semiconductor capable of emitting blue light and light of which wavelength has been converted can be extracted to the outside. Because of comparatively high pliability, the light transmitting resin 8 reduces the thermal stress caused by a difference in thermal expansion coefficient between the light transmitting resin 8 and the LED chip 5, thus making it possible to prevent failures such as crack in the LED chip 5 of the nitride semiconductor and breakage of the wire 7.

The composition of the epoxy resin composition used in the light transmitting resin 8 will now be described in detail.

The epoxy resin composition constituting the light transmitting resin 8 contains, as an essential component, an epoxy resin containing an alicyclic epoxy resin as a main component, an acid anhydride or dicarboxylic acid, and a cation curing agent. If necessary, it further contains a promotor made of a polyhydric alcohol or a polycondensate thereof. Details of the respective components are as follows.

(Epoxy Resin)

Since the light transmitting resin 8 must maintain high light transmittance, it is required that the epoxy resin used in the present invention accounts for 65% by weight or more, preferably 90% by weight or more, of the whole epoxy resin component (total amount of only the epoxy resin excluding a curing agent) and the content of an aromatic component serving as a coloring component, especially a phenol derivative, is reduced as small as possible. As the alicyclic epoxy resin, for example, epoxidated cyclohexene derivative, hydrated bisphenol A diglycidyl ether and diglycidyl hexahydrophthalate ester can be used alone or in combination. It is particularly preferred to mix an epoxidated cyclohexene derivative such as 3,4-epoxycyclohexylmethyl-3',4'-epoxyhexyl carboxylate, as a main component, with diglycidyl hexahydrophthalate ester and, if necessary, an epoxy resin made of a cyclohexane derivative such as hydrogenated bisphenol A diglycidyl ether, and epichlorohydrin. A liquid or solid epoxy resin made of bisphenol A diglycidyl ether can also be mixed, if necessary.

(Acid Anhydride or Dicarboxylic Acid)

As the acid anhydride or dicarboxylic acid, an acid anhydride represented by the following general formula (1) or dicarboxylic acid represented by the following general formula (2).

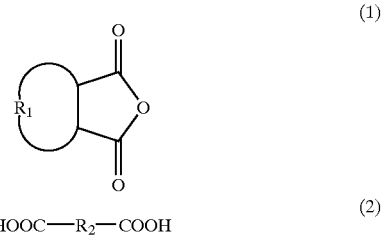

$$\text{HOOC} - R_2 - \text{COOH} \tag{2}$$

In the formulas, $R_1$ represents a cyclic or aliphatic alkyl or aryl having 0 to 12 carbon atoms and $R_2$ represents an alkyl or aryl having 0 to 12 carbon atoms. As the acid anhydride, for example, there can be used propionic anhydride, succinic anhydride, 1,2-cyclohexanedicarboxylic anhydride, 3-methyl-1,2-cyclohexanedicarboxylic anhydride, 4-methyl-1,2-cyclohexanedicarboxylic anhydride, phthalic anhydride, 4,4'-biphthalic anhydride, hexahydrophthalic anhydride, methylhexahydrophthalic anhydride, trialkyltetrahydrophthalic anhydride, and hydrated methyl nadic anhydride. As the dicarboxylic acid, for example, there can be used 4,4'-biphenyldicarboxylic acid, 2,2'-biphenyldicarboxylic acid, oxalic acid, succinic acid, adipic acid, 1,6-hexanedicarboxylic acid, 1,2-cyclohexanedicarboxylic acid, 1,3-cyclohexanedicarboxylic acid, 1,4-cyclohexanedicarboxylic acid, o-phthalic acid, m-phthalic acid, and p-phthalic acid.

When an epoxy resin is mixed with an acid anhydride or dicarboxylic acid to form a crosslinked oligomer and then the crosslinked oligomer is cured by mixing a cation curing agent, the acid anhydride or dicarboxylic acid is mixed in the amount within a range from 0.005 to 0.5 mol, and preferably from 0.01 to 0.2 mol, based on an epoxy equivalent. When the epoxy resin, the acid anhydride or dicarboxylic acid and the cation curing agent are simultaneously mixed and cured, the acid anhydride or dicarboxylic acid is mixed in the amount within a range from 0.005 to 1.5 mol, and preferably from 0.1 to 0.8 mol, based on an epoxy equivalent.

(Cation Curing Agent)

As the cation curing agent, for example, there can be used aromatic sulfonium salt, aromatic diazonium, aromatic iodonium salt and aromatic selenium. The aromatic sulfonium salt is decomposed by heat and/or ultraviolet light having a wavelength of 360 nm or less to generate a cation. Examples thereof include Triphenyl sulfonium Hexafluoroantimonate and Triphenyl sulfonium Hexafluorophosphate. The resin composition can be sufficiently cured by adding a small amount of Triphenyl sulfonium Hexafluoroantimonate because of its large curing rate. The cation curing agent is preferably used in the amount within a range from 0.00005 to 0.003 mol, preferably from 0.0001 to 0.01 mol, and more preferably from 0.0002 to 0.005 mol, based on an epoxy equivalent.

(Promotor)

Examples of the polyhydric alcohol used as a promotor include ethylene glycol, diethylene glycol, trimethylene glycol, triethylene glycol, propylene glycol, 1,4-butanediol, and 1,6-hexanediol. There can also be used a polycondensate obtained by the condensation polymerization of one or more polyhydric alcohols among these polyhydric alcohols. The polyhydric alcohol or polycondensate thereof is used in the amount within a range from 0.1 to 5.0 equivalents, and preferably from 0.2 to 3.0 equivalents, based on the acid anhydride or dicarboxylic acid.

The epoxy resin composition used in the light transmitting resin 8 may contain component other than those described above. For example, the light transmitting resin 8 may contain fillers 10. In addition to the fillers 10, it can contain various functional particles of diffusing agents and colorants.

The method of forming the light transmitting resin 8 will now be described in detail.

The method of forming a light transmitting resin 8 includes, for example, (i) a method of applying a solution, which is prepared by simultaneously mixing an epoxy resin with an acid anhydride and a cation curing agent, and curing the solution, and (ii) a method of applying a solution, which is prepared by reacting an epoxy resin with an acid anhydride to form a crosslinked oligomer and mixing the crosslinked oligomer with a cation curing agent, and curing the coating film. For example, when the light transmitting resin 8 is formed in the thickness of 500 μm or less, the method (ii) is better. By employing the method (ii), volatilization of the acid anhydride can be prevented in case of applying the light transmitting resin 8 in the form of a thin film and curing the thin film. Also the viscosity of the solution to be applied is easily controlled and the pot life is prolonged, so that the workability is improved.

The method (ii) will now be described.

First, an epoxy resin containing an alicyclic epoxy resin, which accounts for 65% by weight or more of the epoxy resin, is reacted with an acid anhydride or dicarboxylic acid in the amount within a range from 0.005 to 0.5 mol, preferably from 0.01 to 0.20 mol, based on an epoxy equivalent to form a crosslinked oligomer in a proper reaction vessel. When using a polyhydric alcohol or a polycondensate thereof as a promotor, it is mixed with the epoxy resin, together with an acid anhydride or dicarboxylic acid. The reaction between the epoxy resin and the acid anhydride or dicarboxylic acid is preferably conducted at room temperature at which the side reaction such as oxidation is less likely to occur. In the case of the acid anhydride, the reaction time is within a range from about 1 to 360 hours. In the case of the dicarboxylic acid, the reaction time is within a range from about 1 to 180 hours. To reduce the reaction time by acceleration of the ring-opening reaction of the acid anhydride, the reaction system may be heated to 50 to 150° C. (preferably 60 to 120° C.).

Then, a solution is prepared by mixing the resulting crosslinked oligomer with a cation curing agent in the amount within a range from 0.00005 to 0.03 mol, preferably 0.0001 to 0.01 mol, based on an epoxy equivalent. The mixed solution is packaged in the inside of a mounting area 1a in which the LED chip 5 of the nitride semiconductor is mounted, and then cured with heating to form a light transmitting resin 8. Preferably, the mixed solution is subjected to primary curing by heating at 80 to 100° C. for 2 to 4 hours and then subjected to secondary curing by heating at 140 to 150° C. for 2 to 4 hours.

More specific method will be described hereinafter.

The pliability of the epoxy resin composition thus obtained finally is proportion to the molecular weight of the crosslinked oligomer during the process. The higher the proportion of carboxyl groups, which are converted into an ester as a result of the reaction with the epoxy resin or promotor, among carboxyl groups of the acid anhydride or dicarboxylic acid, the better the pliability of the resulting epoxy resin composition. The viscosity of the mixed solution of the crosslinked oligomer and the cation curing agent can be freely controlled by adjusting the amount of the acid anhydride or the ester conversion ratio, because the viscosity varies depending on the molecular weight of the crosslinked oligomer.

<Manufacturing Method of Embodiment 1>

Now a method for producing the light emitting diode of the first embodiment will be described below.

This producing method is a method for producing the surface mounted light emitting diode of the first embodiment with stable quality satisfactorily in mass production.

In this producing method, since a plurality of packages are processed collectively to the step of covering the LED chip 5 with the light transmitting resin, a package assembly consisting of a plurality of packages is used. The package assembly is made by bonding an insulating substrate 101 having a plurality of through holes 101a that correspond to a mounting area 1a of each package, and a metal base plate 102.

The insulating substrate 101 comprises, for example, a laminated resin of thickness from 0.06 mm to 2.0 mm and has a plurality of through holes 101a penetrating therethrough in the direction of thickness. Cross section of the through hole 101a may be oval, circular or rectangular. That is, the present invention is not limited in terms of the cross sectional shape of the through hole 101a that can be selected from among various shapes. Inner wall of the through hole 101a is preferably tapered neat the opening so that the diameter thereof increases from one side of the insulating substrate (surface to be bonded with a thin metal sheet) toward the other side. When the inner wall of the through hole 101a is tapered, light emitted by the LED chip toward the inner wall can be reflected thereon and directed upward, thus making it possible to extracting the light emitted by the LED chip 5 efficiently from the light emitting element.

The metal base plate 102 has separation grooves formed therein in correspondence to the through holes with the grooves filled with an insulating resin 4, so that thin metal sheet 2a and the thin metal sheet 2b are electrically isolated from each other by the insulating resin 4 in each package when the packages are cut off.

A part of thin metal sheet 2a, the insulating resin 4 and a part of the thin metal sheet 2b are exposed in the through hole 101a in each package.

Also in the package assembly, the plurality of packages are disposed in a group for each opening 113 of the mask 112 to be described later.

<Mounting of LED Chip>

Figure 5:
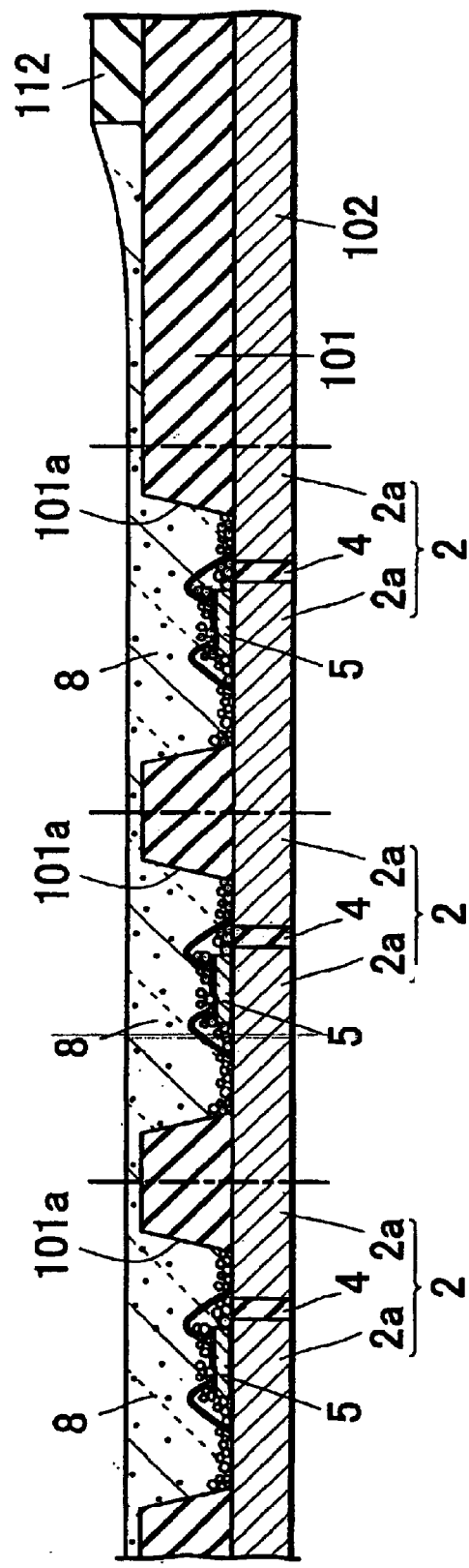
FIG. 5 is a sectional view showing a part of a package assembly after curing of a light transmitting resin applied by the mimeograph printing in the producing method of the first embodiment.

The LED chips 5 are die-bonded at predetermined positions in the through holes (mounting areas) of the package assembly constituted as described above, and wiring is provided as required by wire bonding (FIG. 5).

The thin metal sheet 2a and the thin metal sheet 2b are exposed in the through hole, and the LED chip 5 is bonded onto the thin metal sheet 2b that is a negative electrode, while a p-type electrode 5a and an n-type electrode 5b of the LED chip 5 are connected to the thin metal sheet 2a and the thin metal sheet 2b, respectively by means of wires 7.

<First Process: Mimeograph Printing>

Figure 3A:
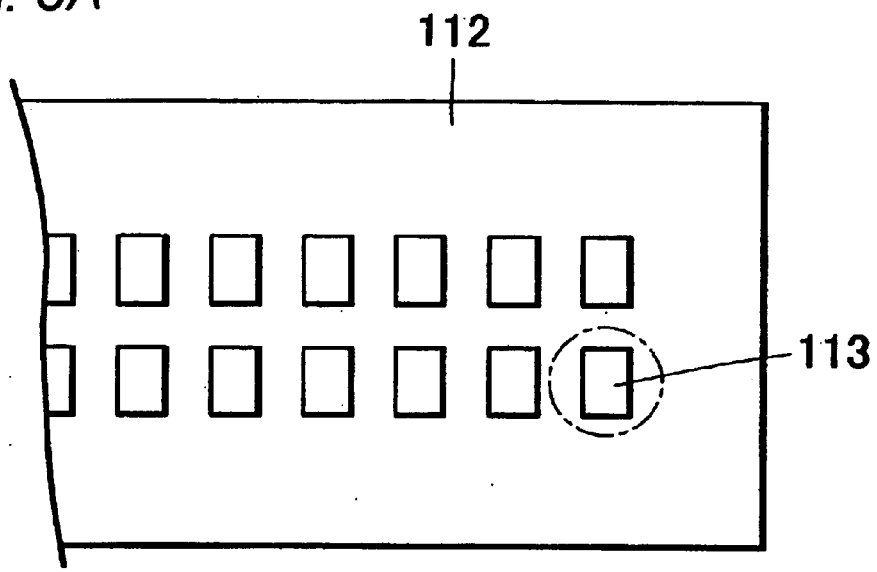
FIG. 3A is a schematic plan view of a mask used in mimeograph printing in the producing method of the first embodiment.
Figure 3B:
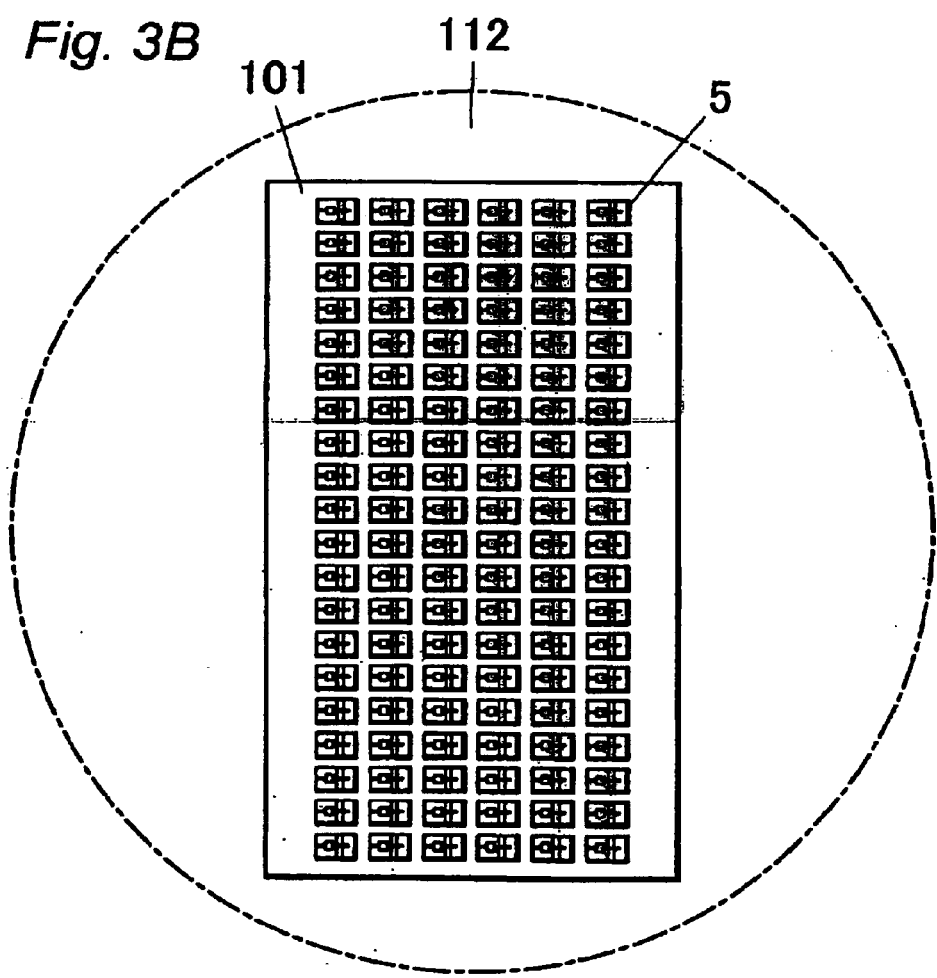
FIG. 3B is a schematic plan view showing an enlarged portion of the mask shown in FIG. 3A.

The light transmitting resin (epoxy resin composition of the present invention) 8 that serves as the sealing member is applied by mimeograph printing in a chamber. FIG. 3A is a plan view of the mask 112 used in the mimeograph printing according to the producing method of the first embodiment. The mask 112 has a plurality of apertures 113 as shown in FIG. 3A, position and size of each aperture 113 being set so that a plurality of packages of one group correspond to one of the apertures 113 (FIG. 3B). Thus the mask used in the present invention is designed so as to form the light transmitting resin layer not only in the through holes but also in the surrounding thereof on the insulating substrate 101. According to the producing method of this embodiment, such a light transmitting resin layer that maintains a smooth surface even after curing can be formed on the inner surfaces of the through holes 101a of the insulating substrate and on the insulating substrate 101 by carrying out the mimeograph printing using the mask 112 as described above.

Specifically, in this producing method, groups each consisting of a plurality of packages are disposed except for areas around the apertures 113 where it is difficult to apply the light transmitting resin with a flat surface, as shown in FIG. 5. Thus the light transmitting resin layer having uniform thickness and flat surface is formed in the portions where the plurality of packages are disposed, so as to suppress the variations in the thickness of the light transmitting resin layer between packages and make the light transmitting resin surface of each package flat.

After forming the light transmitting resin layer in a single step for the plurality of light emitting diodes as described above, individual light emitting diodes are separated by cutting along the dashed lines shown in FIG. 5. Thus the light emitting diodes having uniform thickness can be manufactured with high yield without variations in the size and color among the light emitting diodes. Thickness of the light transmitting resin layer formed on the insulating substrate can be changed freely by controlling the thickness of the mask.

Now an example of method for the light transmitting resin layer having uniform thickness and flat surface in the portions where the plurality of packages are disposed around the apertures 113 will be described below.

(Step 1)

First, the package assembly 100 having the through holes 101a facing toward the mask 112 is sucked onto a elevation stage 117 (FIG. 4A), the stage 117 is lifted with the package assembly 100 and the mask 112 aligned and put into contact with the bottom surface of the mask 112 (FIG. 4B). This makes it possible to bring the package assembly 100 into contact with the mask 112 in such a state as warping of the package assembly being corrected. As warping of the package assembly is corrected as described above, the light transmitting resin layer of uniform thickness can be formed on one surface of the package assembly 100. Forming the sealing member in the warped state on the substrate leads to variations in thickness among the light emitting diodes, thus resulting in lower yield.

The light transmitting resin that includes the fluorescent material is applied on outside of the apertures of the mask 112 under the atmospheric pressure as shown in FIG. 4A, and the resin is deaerated by decreasing the pressure in this condition. The decreased pressure is preferably within a range from 100 to 400 Pa, which makes it possible to effectively remove bubbles from the resin. In this embodiment in which the package assembly 100 and the mask 112 are used, the light transmitting resin having a relatively high viscosity can be used.

In case the fluorescent material is used while being included in the light transmitting resin as in the first embodiment, it is preferable to use a resin that has a certain level of viscosity in order to ensure homogeneous dispersion, since the fluorescent particles of large particle size precipitate at a fast rate in the liquid resin. However, a resin of higher viscosity is difficult to deaerate and may lead to lower yield of production. For this reason, in the present invention, the mimeograph printing is carried out while repeating the pressurization and depressurization after removing bubbles by decreasing the pressure, so as to make it possible to use the light transmitting resin of high viscosity without decreasing the yield of production. Thus a resin of high viscosity can be used in order to minimize the color inconsistency that tends to occur when fluorescent particles of large particle size are used. Also the light emitting diode can be manufactured with high yield even when a resin of high viscosity is used.

In case sealing is done with the light transmitting resin including bubbles, the bubbles reflect and refract light emitted by the LED chip and light emitted by the fluorescent material, resulting in conspicuous irregular color and unevenness in luminance. To prevent this problem, it is very effective in suppressing irregular color and unevenness in luminance, to repeat the cycle of decreasing and increasing the pressure as in this embodiment when applying the light transmitting resin that includes the fluorescent material. Bubbles included in the light transmitting resin may also lead to peel-off of the light transmitting resin and/or wire-bonded portion and wire breakage, resulting in lower reliability. Therefore removal of the bubbles by the method of this embodiment is very effective also in improving the reliability.

<Step 2>

Figure 4C:
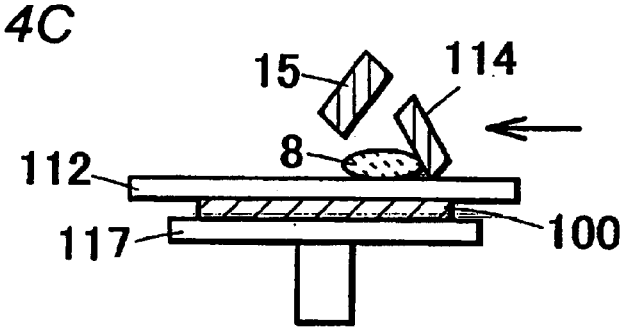

Then first cycle of forward squeegee sweep is carried out under decreased pressure (FIG. 4C). A forward squeegee spatula 114 used in this operation is inclined forward with respect to the vertical line of the mask 112 as shown in FIG. 4C, and is pressed by pneumatic pressure against the mask 112 so as to move and squeeze the resin 8 into the aperture 113 of the mask 112. Since the forward squeegee sweeping operation is carried out under decreased pressure, suction of the elevation stage 117 is not effective. But displacement between the package assembly 100 and the mask 112 does not occur because the elevation stage 117 is pressed physically against the mask 112.

<Step 3>

Figure 4D:
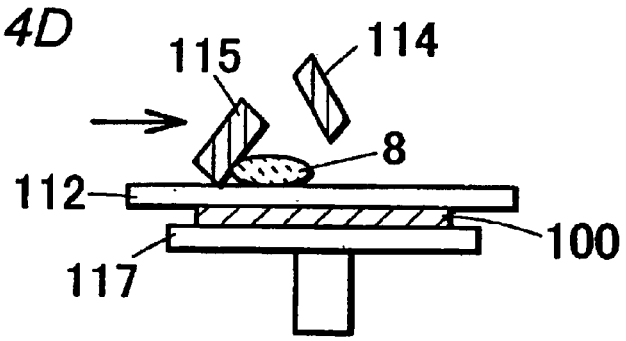

Then the ambient pressure is increased to the atmospheric pressure and, upon completion of pressure increase, first cycle of return squeegee sweep is carried out in a direction opposite to the forward squeegee sweep (FIG. 4D). A return squeegee spatula 115 is inclined toward the moving direction with respect to the vertical line of the mask 112 more steeply than the forward squeegee spatula 114 and is moved by larger pneumatic pressure than that in the forward squeegee sweep operation. As the light transmitting resin is squeezed again with a larger contact area between the return squeegee spatula 115 and the mask 112, bubbles can be removed efficiently from the resin that fills the apertures 113 so that the sealing member can be finished with smoother surface.

<Step 4>

Several cycles of forward and return squeegee sweeping operations are carried out while repeating the pressure decreasing and increasing cycles similarly to the step 2 and step 3, thereby to fill the aperture 113 with the resin of uniform thickness.

\<Step 5\>

With the mask 112 in contact with the package assembly 100, the light transmitting resin is cured and then the mask is removed. Thus the light transmitting resin formed integrally in the through hole wherein the LED chip is placed and on the top surface of the insulating substrate can be made to have top surface that is flat and substantially parallel to the bottom surface of the package.

When the method of forming the sealing resin by mimeograph printing is employed as described above, the light transmitting resin having relatively high viscosity before curing can be used. Consequently, unlike in the case of using a resin of low viscosity, the fluorescent material does not precipitate or migrate in the resin. As a result, relatively good mixed state of the fluorescent material can be maintained. In addition, the period in which the light transmitting resin remains during the forming process is from several tens of seconds to several minutes, far shorter than several hours in the case of potting process in which molten resin is poured into the through holes and cured by heat. Moreover, since the time taken to cure can also be made very short, the fluorescent material particles can be prevented from precipitating one on another on the LED chip.

Thus according to the producing method of the first embodiment, since the light transmitting resin of high viscosity can be used, the resin and the fluorescent material can be prevented from separating from each other in the period after mixing the fluorescent material in the light transmitting resin till application to the substrate. As a result, variations in the content of fluorescent material included in the resin among the light emitting diodes can be minimized, thus making it possible to manufacture the light emitting diodes with less variation in the color of the emitted light within a production lot and among different production lots. Yield of production can also be improved.

Also the fluorescent particles of large particle size can be prevented from precipitating densely near the surface of the LED chip in the period between filling the through holes and curing of the resin, so that wavelength converting function of the fluorescent particles of large particle size can be effectively utilized. Further, the fluorescent particles of small particle size can be distributed uniformly in the light transmitting resin around the fluorescent particles of large particle size, thus preventing light emitting diodes from experiencing irregular color.

Particularly in case the light emitting diode includes YAG:Ce fluorescent material as the fluorescent material so as to emit white light, the fluorescent material has larger specific gravity than the light transmitting resin and tends to precipitate densely. Even in this case, the fluorescent particles of large particle size 81 can be prevented from precipitating densely near the surface of the LED chip 5, so that the light emitting diodes of uniform color temperature can be manufactured reliably.

Now the dicing process will be described in detail below. Individual light emitting diodes are separated through the dicing process as described below after the light transmitting resin has been cured.

\<Second Process: Dicing Process\>

(Dicing Step 1)

After curing the resin, the package assembly 100 is bonded onto a dicing sheet on the light transmitting resin side. The bonding strength can be increased since the bonding surfaces of the package assembly 100 and the dicing sheet are made of substantially the same material and are flat planes. As a result, the chips can be prevented from coming off and mis-positioning in dicing can be prevented, making possible to separate into the individual light emitting diodes with high yield.

In case the resin is applied and cured by using a mask that has apertures corresponding to the individual through holes of the package assembly, in contrast, the applied resin shrinks and sinks over the through holes, resulting in decreased bonding strength because only the surface of the insulating substrate other than the areas over the through holes makes contact with the dicing sheet. In case a larger amount of the resin is applied and cured by using the mask that has apertures corresponding to the individual through holes, on the other hand, the resin surface becomes higher than the top surface of the insulating substrate that is to be diced and only the resin surface makes contact with the dicing sheet as the bonding surface, thus resulting in very weak bonding strength between the package assembly and the dicing sheet that leads to mis-positioning in dicing. When dicing is carried out with the package assembly and the dicing sheet held together in unstable condition as described above, the chips tend to come off and mis-positioning in dicing is likely to occur. The light emitting diodes thus obtained may also have such undesirable cut surfaces that have burrs or the like. The burrs may break in the packaging process that follows. When the burrs break to a depth, moisture infiltrates from the outside into the sealing member. This decreases the reliability of the light emitting diode and causes such defects as metallic members sealed inside are oxidized and discolor.

\<Step 2\>

The package assembly that is fixed closely on the dicing sheet in step 1 is cut off by means of a dicing blade applied onto the bottom surface of the package assembly along the dashed lines in FIG. 5. The dicing blade has a cutting edge consisting of fine diamond particles around a bond. The diamond blade of this constitution tends to be loaded with metal chips generated as saw dust when cutting off the light emitting diodes that fill the space between the diamond particles. In order to avoid this problem, it is preferable to include a hard filler in the light transmitting resin that makes the sealing member in the first process, in which case the loading metal chips are pushed out so that dicing operation can be carried out smoothly. Use of a filler of larger particle size increases the operation and effect. Using the fluorescent particles of large particle size as a filler increase the effect since the fluorescent particles of large particle size has high hardness.

In the light emitting diode manufactured by the producing method described above, the light transmitting resin seal is formed integrally on the top surface of the insulating substrate and in the through hole of the insulating substrate, top surface of the light transmitting resin is substantially parallel to the bottom surface of the package, and the outer circumferential surface of the light transmitting resin is substantially flush with the outer circumferential surface of the package. As the light transmitting resin is formed over the entire surface of the light emitting diode, light emitting surface can be made wider with increased output power. Moreover, since the light transmitting resin on the insulating substrate diffuses light from the LED chip more effectively to the outside, the light emitting diode has good directivity. In case the light transmitting resin includes the filler, the effect is further enhanced by the filler, so that the light emitting diode has favorable light emitting characteristics.

In the light emitting diode of the first embodiment according to present invention, the luminous intensity and power can be increased by using florescent material classified so as to have the fluorescent particles of small particle size and the fluorescent particles of large particle size and disposing the florescent material to make full use of each function. The fluorescent particles of small particle size account for 0.01 vol % to 10 vol % of the total volume of fluorescent material and are dispersed in the transmitting resin to scatter the light. The fluorescent particles of large particle size can convert the wavelength of the light efficiently by controlling the particle size thereof so that the particles can be distributed in the vicinity of the LED chip. Since the fluorescent particles of large particle size of this embodiment can be excited by the light in a broad wavelength band, the fluorescent particles can convert the wavelength of the light in the case that the wavelength of the light emitted from the LED chip varies by a change of the current. Therefore, it is possible to provide the light emitting diode with a good reliability and a good productivity.

In the method for producing the light emitting diode according to this embodiment, the light emitting diode with a good luminance characteristic can be produced efficiently. Moreover, in the case that production process need a long period time, variations in the light emission performance can be kept extremely small between the light emitting diodes manufactured in the early stage of the production run and the light emitting diodes manufactured in the latter stage of the production run. Therefore, the irregular color of the light emitting diode can be prevented and the yield of production can be improved.

The epoxy resin composition of the present invention described in the first embodiment can be prevent yellowing and has a high pliability, because a crosslinked oligomer formed by reacting the alicyclic epoxy resin reacts with the acid anhydride or dicarboxylic acid.

The epoxy resin composition of present invention can be handled easily, since the viscosity of the epoxy resin composition can be freely controlled by the amount of the acid anhydride or the dicarboxylic acid, or the ester conversion ration and has long pot life.

Embodiment 2

Figure 6:
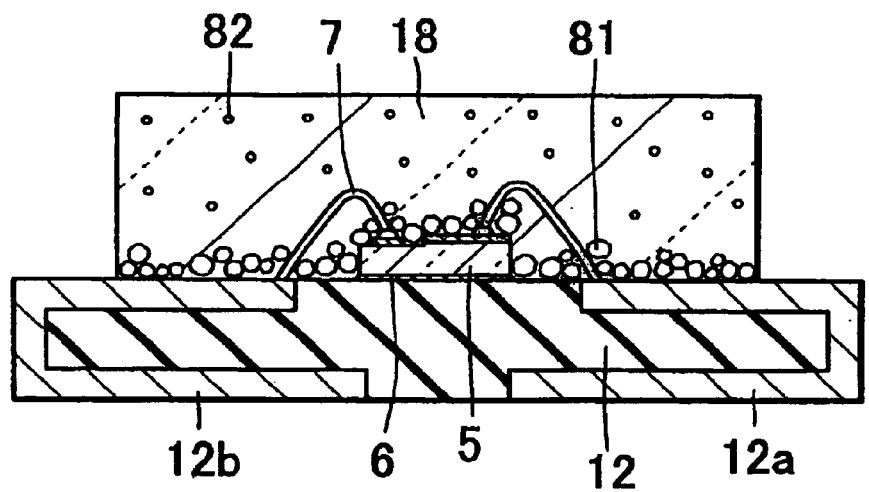
FIG. 6 is a schematic sectional view of an SMD type light emitting diode according to second embodiment of the present invention.

FIG. 6 is a schematic sectional view of an SMD type light emitting diode according to second embodiment of the present invention. The light emitting diode of the second embodiment comprises the LED chip 5 made by forming a pn junction of a nitride semiconductor ($Al_X Ga_Y In_Z N$, $0 \leq X \leq 1$, $0 \leq Y \leq 1$, $0 \leq Z \leq 1$, $X+Y+Z=1$) on a sapphire substrate via a buffer layer made of $Ga_d Al_{1-d} N$, $0 \leq d \leq 1$), the LED chip 5 being placed on a glass epoxy substrate 12 that has a pair of lead electrodes 12a, 12b. The LED chip 5 has a light emitting layer made of at least a nitride semiconductor layer. Positive and negative electrodes provided on at least one surface of the LED chip 5 are electrically connected to lead electrodes 12a, 12b with electrically conductive wires 7.

In the light emitting diode of the second embodiment, a fluorescent material similar to that of the first embodiment is dispersed in the light transmitting resin 18.

The fluorescent material dispersed in the light transmitting resin 18 consists of the fluorescent particles of large particle size 81 and the fluorescent particles of small particle size 82. Thus the wavelength converting function of all the fluorescent particles of large particle size 81 is fully made use of thereby to improve the output power of the light emitting diode, while preventing irregular color from occurring by means of the fluorescent particles of small particle size 82.

In the light emitting diode of this present invention, epoxy resin described in the first embodiment is preferably used for the light transmitting resin 18.

However, in the second embodiment, since the resin is molded on the substrate instead of filling the inside of the package, other epoxy resin, glass, silicone resin, acrylic resin or the like suitable for the producing method may also be used.

Embodiment 3

The light emitting diode according to the third embodiment of the present invention comprises an LED chip having a constitution, for example, shown in FIG. 1 or FIG. 6 capable of emitting ultraviolet ray with a main peak of emission in a short wavelength region around 400 nm. An LED chip capable of emitting ultraviolet ray can be easily made by growing a semiconductor layer based on a nitride semiconductor on a sapphire substrate.

In the light emitting diode of the third embodiment, a resin or glass that is somewhat resistant to the ultraviolet ray is used as the light transmitting resin, and a fluorescent material having the particle size distribution described in the first embodiment is used.

For the material of the fluorescent material, $Y_2O_2S:Eu$ fluorescent material that is excited by light of short wavelengths in the ultraviolet region and emits red light, $Sr_5(PO_4)_3Cl:Eu$ fluorescent material that is excited by light of short wavelengths in the ultraviolet region and emits blue light or $(SrEu)O.Al_2O_3$ that is excited by light of short wavelengths in the ultraviolet region and emits green light can be used.

A light emitting diode that emits white light can be manufactured by forming a wavelength conversion layer made of a mixture of a red light emitting fluorescent material, a blue light emitting fluorescent material and a green light emitting fluorescent material on the surface of the LED element.

Besides the fluorescent material described above, $3.5 MgO.0.5 MgF_2.GeO_2:Mn$, $Mg_6As_2O_{11}:Mn$, $Gd_2O_2:Eu$ or $La_2O_2S:Eu$ may be used as the red fluorescent material, $Re_5(PO_4)_3Cl:Eu$ (Re is at least one element selected from among Sr, Ca, Ba and Mg), $BaMg_2Al_{16}O_{27}:Eu$, or the like may be used as the blue fluorescent material. The light emitting diode capable of emitting white light with high luminance can be made by using these fluorescent materials.

In the light emitting diode of the third embodiment, since the fluorescent material consists of the fluorescent particles of large particle size 81 and the fluorescent particles of small particle size 82 similarly to the first embodiment, the wavelength conversion layer capable of efficiently converting light of ultraviolet region is formed so that the light emitting diode of high luminance can be obtained. Particularly when fluorescent materials of a plurality of types are used to emit mixed light, it is preferable since irregular color can be effectively suppressed by the light scattering effect of the fluorescent particles of small particle size.

When a thin layer having wavelength converting function is formed from a mixture of such fluorescent materials described above, the fluorescent materials preferably have similar median particle size and particle shape, since this makes it possible to satisfactorily mix light of different wavelengths emitted by the different fluorescent materials thereby to suppress irregular color.

In the third embodiment, different wavelength conversion layers may also be formed from different fluorescent materials. In case different wavelength conversion layers of different fluorescent materials are formed in multiple layers, it is preferable to form a red light emitting fluorescent material, a green light emitting fluorescent material and a blue light emitting fluorescent material one on another in this order on the LED chip in consideration of the transmittance of each fluorescent material for ultraviolet ray, since this causes all layers to efficiently absorb light in the ultraviolet region. Furthermore, it is preferable that the particle sizes of different fluorescent materials are controlled so that the blue fluorescent material has the largest median particle size followed by the green fluorescent material and then the red fluorescent material in order to have the particle sizes of the fluorescent material decrease from the lower layer to the upper layer in the multiple wavelength conversion layers, since this allows ultraviolet rays to efficiently transmit up to the topmost layer and also makes it possible to have the ultraviolet rays completely absorbed by the multiple wavelength conversion layers.

The wavelength conversion layers for different colors may also be formed on the LED chip in such a configuration as stripes, grating or triangle. In this case, the layers including the different fluorescent materials may be disposed at a distance from each other, which improves the color mixing performance. It is also preferable to form the wavelength conversion layer so as to cover the LED chip as a whole, since this makes it possible to prevent the ultraviolet rays from being absorbed in the outside of the sealing resin.

Embodiment 4

Fourth embodiment of the present invention relates to a method for producing the fluorescent material that is suited for the light emitting diode, in which such a fluorescent material is synthesized that chromaticity of the emitted light can be prevented from shifting and red component can be prevented from decreasing.

A method for synthesizing the fluorescent material is disclosed in Japanese Unexamined Patent Publication No. 4985/1973 in which various materials of fluorescent material are mixed in stoichiometrical proportions and boric acid is added thereto as flux, with the mixture being fired. Japanese Unexamined Patent Publication No. 36038/1986 discloses such a method as various materials of fluorescent material are mixed in stoichiometrical proportions and barium fluoride is added thereto as flux, with the mixture being processed to grow particles.

When barium fluoride and boric acid is added as the flux to the fluorescent material so as to assist the growth of particles, chromaticity of the emitted light obtained by the irradiation with excitation light shifts and the red component decreases.

In the fourth embodiment, shift in chromaticity of the emitted light of fluorescent material is suppressed by adding a liquid to the mixture before firing the mixture of the mixed materials of fluorescent materials and the flux including barium fluoride. It is supposed that addition of the liquid during firing makes the mixed materials denser and improves reactivity so that homogeneous fluorescent particles of uniform particle sizes can be obtained. The effect can be improved further by pressurizing during firing.

The more the amount of the liquid added, the better the particle shape and the higher the effect of suppressing the chromaticity shift of the emitted light. The amount of the liquid added is preferably within a range from 5 to 200 wt %, more preferably within a range from 10 to 70 wt % and most preferably within a range from 50 to 70 wt % of the mixed material. The above effect can be enhanced by adding Fe in addition to Ce as the activation agent for the fluorescent material.

Also according to the method for producing, it is preferable to fire the fluorescent material of the fourth embodiment, the mixture of the mixed materials of fluorescent materials and the flux in two steps comprising a first firing step of firing in an air or weakly reducing atmosphere and a second firing step of firing in a reducing atmosphere.

In the present invention, the weakly reducing atmosphere refers to an atmosphere that includes oxygen of such a concentration that at least the quantity of oxygen required in the reaction of forming the desired fluorescent material from the mixed material. The fluorescent material can be prevented from blackening and the light absorbing efficiency can be prevented from decreasing, by carrying out the first firing step until the process of forming the desired fluorescent material is completed in the weakly reducing atmosphere. The reducing atmosphere in the second firing step is a reducing atmosphere that has higher reducing power than the weakly reducing atmosphere.

A fluorescent material having high efficiency of absorbing excitation light can be obtained by firing in two steps as described above. This makes it possible to reduce the amount of the fluorescent material required to obtain the desired chromaticity and obtain a light emitting diode having high efficiency of extracting light, for example, when the method is applied to the light emitting diode.

Variation Example 1
(Light Transmitting Resin)

While a particular epoxy resin is used in the first embodiment, according to the present invention, the light emitting diode may also be made by mixing other resin or glass and the fluorescent material described in the first embodiment.

In this case, materials that can be suitably used as the light transmitting resin include light transmitting resins having good weatherability such as other type of epoxy resin (for example, nitrogen-containing epoxy resin), acrylic resin and silicone and glass. A light emitting diode of high output power can be made also by including fluorescent material consisting of fluorescent particles of large particle size and fluorescent particles of small particle size in such a resin as described above. A pigment may also be added together with the fluorescent material to the light transmitting resin.

In order to improve weatherability of the light transmitting resin, an ultraviolet absorbing agent may also be added to the light transmitting resin, and further an antioxidant, organic zinc carboxylate, acid anhydride or chelate compound of zinc may also be added to the light transmitting resin.

Variation Example 2
(Diffusing Agent)

Further according to the present invention, the light transmitting resin may include a diffusing agent in addition to the fluorescent material. For the diffusing agent, barium titanate, titanium oxide, aluminum oxide, silicon oxide, calcium carbonate or the like is preferably used. Organic diffusing agents such as melanin resin, CTU guanamine resin and benzoguanamine resin can also be used.

The light emitting diode having good directivity can be made by adding the diffusing agent as described above.

The diffusing agent in this specification has median particle size of 1 nm or over and less than 5 $\mu$m. It is preferable to use the diffusing agent having median particle size within a range from 1 $\mu$m to 5 $\mu$m, since it causes satisfactory random reflection of light emitted by the LED chip and the fluorescent material and suppression of irregular color that tends to occur when the fluorescent particles of large particle size is used. Use of the diffusing agent also makes it possible to make the half width of the light emission spectrum narrower and obtain the light emitting diode having high color purity.

The diffusing agent having median particle size or 1 nm or over and less than 1 $\mu$m has lower effect of interfering with the light emitted from the LED chip but can improve the viscosity of the resin without decreasing the luminous intensity. When this effect is utilized in a process of filling the recess of package with a resin by potting or the like, it is made possible to disperse the fluorescent material substantially uniformly in the resin that is contained in a syringe and maintain this condition, and therefore high yield of production can be achieved even when the fluorescent particles of large particle size that is relatively difficult to handle is used. As can be seen from the above discussion, the diffusing agents used in the present invention have different actions depending on the range of particle sizes, and can be used in proper combinations according to the application.

Variation Example 3
(Filler)

Further according to the present invention, the light transmitting resin may contain fillers, in addition to the fluorescent material. Specific material that can be used as the filler are the same as those for the diffusing agent, although the median particle size is different. The filler in this specification has median particle size within a range from 5 $\mu$m to 100 $\mu$m. When the filler having median particle size in this range is included in the light transmitting resin, variation in the chromaticity of light emitted by the light emitting diode is improved by the light scattering effect and resistance of the light transmitting resin against the thermal shock can be improved. This makes it possible to prevent such troubles as breakage of wires that connect the LED chip and electrodes of the package and peel off of the bottom surface of the LED chip and the bottom of the package recess even when used at high temperatures. Thus the light emitting diode of high reliability can be provided. Moreover, it is made possible to regulate the fluidity of the resin at a constant level over an extended period of time and applying a required amount of the light transmitting resin to a desired position, thus allowing for mass production with a high yield.

The filler has preferably similar particle size and/or shape to those of the fluorescent material. In this specification, the expression "similar particle size" means that the difference in the median particle size is less than 20%, and the expression "similar shape" means that the difference in the roundness factor (length of circumference of a true circle of the same area as the projected area of the particle/length projected of circumference of the particle) that represents the degree of proximity of the particle shape to the true circle is less than 20%. Use of such a filler results in interaction of the fluorescent material and the filler that causes the fluorescent material to be favorably dispersed in the resin thereby to suppress the irregular color. Both the fluorescent material and the filler preferably have median particle sizes within a range from 15 $\mu$m to 50 $\mu$m, more preferably within a range from 20 $\mu$m to 50 $\mu$m. The particles can be dispersed with desirable distance from each other when the particle sizes are controlled in the range described above. This makes it possible to secure a path to extract light and improve the directivity while preventing the luminous intensity from decreasing due to the mixing of the filler. When the light transmitting resin including the fluorescent material and the filler of particle sizes in the range described above is applied by the mimeograph printing, dressing effect can be provided in which the dicing blade is restored from loaded condition in the dicing process after curing the light transmitting resin, thus improving the mass production performance.

In order to achieve good dressing effect in the dicing process, it is preferable that the filler of larger particle sizes is included. Good dressing effect can be achieved for effectively restoring loaded dicing blade when the light transmitting resin includes a filler having median particle size within a range from 15 $\mu$m to 50 $\mu$m, more preferably within a range from 20 $\mu$m to 50 $\mu$m.

Variation Example 4
(Light Emitting Surface)

According to the present invention, the light transmitting resin surface that serves as the light emitting surface of the light emitting diode may be a curved surface. In the case of the light emitting diode described in the second embodiment in which the resin is molded on the substrate, the light transmitting resin surface is preferably formed in a curved surface so as to achieve the desired directivity, since light cannot be reflected upward on the side wall of the package in this type of light emitting diode.

Figure 7A:
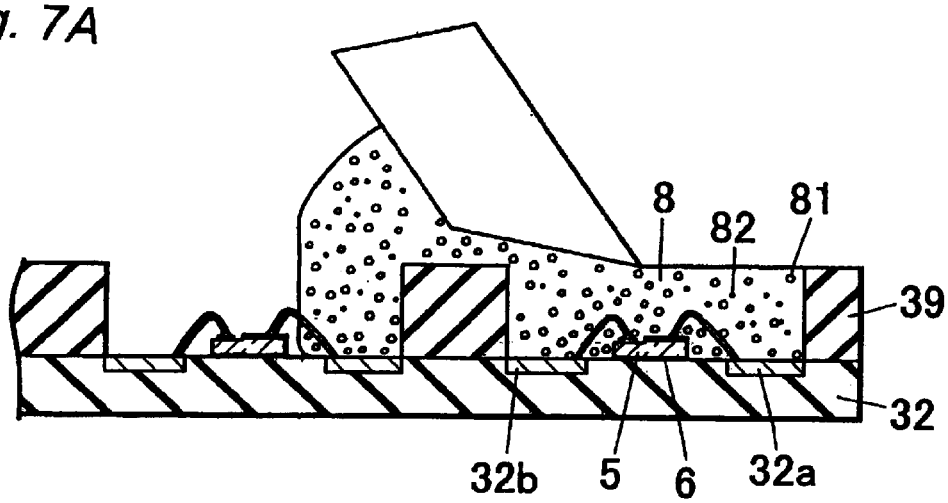
FIG. 7A and FIG. 7B are sectional views showing processes of forming a light transmitting resin of a light emitting diode Example 5.
Figure 7B:
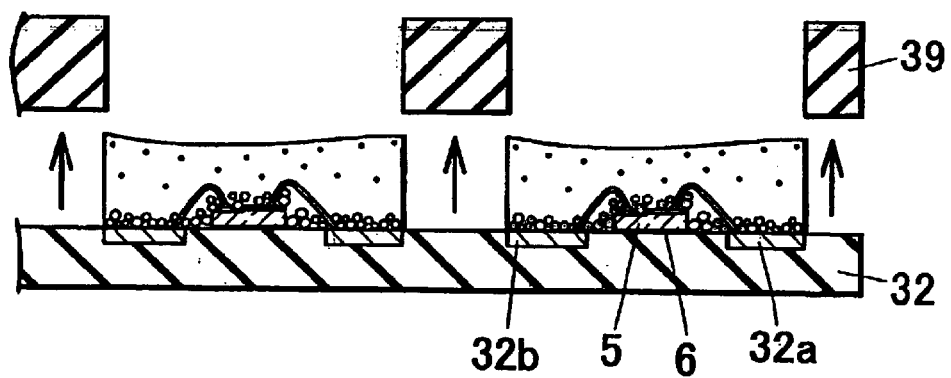

Such a curved light emitting surface can be formed by applying the light transmitting resin including necessary substances dispersed therein in the mimeograph printing using a mask 39 (FIG. 7A) having apertures formed therein in correspondence to the individual light emitting diodes. This process is illustrated in FIG. 7A and FIG. 7B. While the surface of the light transmitting resin applied as described above usually becomes a curved surface after thermosetting of the resin, the surface can be formed in any desired shape according to the material and configuration of the mask 39. and the quantity of resin applied. With this method, the light emitting diode can be manufactured satisfactorily in mass production. Even when the light emitting diodes of the present invention including fluorescent particles of large particle size and fluorescent particles of small particle size are manufactured in a large quantity over a long period of time, variations in the light emission performance can be kept extremely small between the light emitting diodes manufactured in the early stage of the production run and the light emitting diodes manufactured in the latter stage of the production run, thereby improving the yield of production.

Moreover, when silicone is used as the material of the mask 39, producing cost can be reduced and the light emitting surface of a desired curve can be formed by making use of the difference in the thermal expansion coefficient between the silicon and the light transmitting resin.

Variation Example 5

While the LED chip and the package are connected by means of wires in the first embodiment, although the present invention is not limited to this constitution and such a constitution may also be employed as the LED chip is mounted in the mounting area 1*a* of the package by flip chip-bonding with conductive material and output light is extracted from the substrate side of the LED chip.

Since the package has the insulating section 4 located in the mounting area 1*a* (through hole) with the thin metal sheets 2*a*, 2*b* exposed on both sides as shown in FIG. 1, it suffices to mount the LED chip so as to straddle over the insulating section 4 and connect the positive and negative electrodes of the LED chip directly to the thin metal sheets 2*a*, 2*b*, respectively.

Variation Example 6

The light emitting diodes of the embodiments and variation examples described above are SMD type light emitting diodes, although the present invention is not limited to this constitution.

For example, the fluorescent material and/or the epoxy resin described in the first embodiment can be used in light emitting diodes of various forms such as display, 8-segment indicator and bullet type.

That is, use of the fluorescent material described in the first embodiment makes it possible to make a light emitting diode of high output power and use of the epoxy resin described in the first embodiment makes it possible to make a light emitting diode of high reliability.

The light transmitting resin described in the first embodiment can be applied not only to light emitting elements such as light emitting diode but also to light receiving element such as photodiode.

The present invention will be described in the following examples and is not limited only to such examples.

EXAMPLE 1

Figure 8:
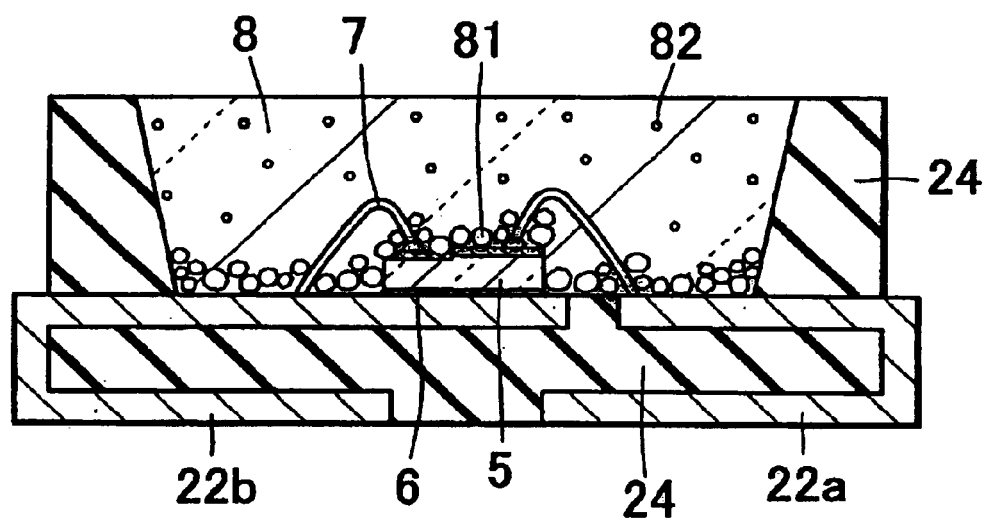
FIG. 8 is a schematic sectional view of an SMD type light emitting diode according to Example 1 of the present invention.

The SMD type light emitting diode as shown in the sectional view of FIG. 8 is fabricated as a light emitting diode of the present invention. The LED chip comprising a light emitting layer made of InGaN and having a main peak of 470 nm is used as a LED chip 5. In the light emitting diode of Example 1, the package is a molded resin body formed in one piece of the base part and the side wall part. The electrode leads 22a and 22b are insertion molded into the base part of the resin 24. The LED chip can be formed by making use of MOCVD method. More specifically, the cleaned sapphire substrate is set in to the reactor chamber and films are formed using trimethylgallium (TMG) gas, trimethylindium (TMI) gas and ammonia gas as a reactive gas, and hydrogen gas as a carrier gas, and silane gas and cyclopentadiamagnesium as a impurity gas.

The LED chip comprises a AlGaN layer as a low temperature buffer layer, a non-doped GaN layer to enhance a crystallinity (thickness: about 15000 Å), a Si-doped GaN layer as an n-type contact layer on which an electrode is formed (thickness: about 21650 Å), a non-doped GaN layer to enhance a crystallinity (thickness: about 3000 Å), a multi-layered film in the form of a super lattice made of a non-doped GaN layer (thickness: about 50 Å) and a Si doped GaN layer (thickness: about 300 Å) as a n-type cladding layer, a multi-layered film in the form of a super lattice made of a non-doped GaN layer (thickness: about 40 Å) and a non-doped InGaN layer (thickness: about 20 angstrom) to enhance a crystallinity of the light emitting layer, a light emitting layer in the multi quantum well structure made of a non-doped GaN layer (thickness: about 250 Å) and a non-doped InGaN layer (thickness: about 30 Å), a multi-layered film in the form of a super lattice of a Mg-doped InGaN (thickness: about 25 Å) and a Mg-doped GaAlN (thickness: about 40 Å) and a GaN layer doped with Mg as a p-type contact layer (thickness: about 1200 Å), which are sequentially formed, on the sapphire substrate.

The semiconductor wafer on which multiple nitride semiconductor layers have been formed in such a way is etched partially to expose a part of the n-type contact layer. Then, on the exposed p-type and n-type contact layers, the n-type and p-type electrodes are formed, respectively, using sputtering technique. Thereafter, the resulting wafer is cut into the respective light emitting device to fabricate a LED chip which is able to emit blue light.

The LED chip fabricated in the above-mentioned way is die-bonded with a die bonding resin 6 to the hollow of the package formed by molding integrally the lead electrodes 22a and 22b to the resin 24. Each electrode of the LED chip and each of the lead electrode 22a and 22b are wire-bonded using gold wire 7 having a diameter of 35 μm, respectively, to establish electric connection.

In Example 1 of the present invention, $(Y_{0.8}Gd_{0.2})_{2.965}Al_5O_{12}:Ce_{0.035}$ in which about 20 percent of Y is substituted with Gd and which has a central particle size of 21.429 μm is used as a fluorescent material. The fluorescent material is composed of a fluorescent particles of large particle size and a fluorescent particles of small particle size and has a volume-based particle size distribution as shown in FIGS. 2A and 2B. In the flat range having a slope of zero in the curve of the volume-based particle size distribution, the cumulative percentage of particles is 4.6 vol % and the particle size ranges from 1.371 μm to 8.379 μm. That is, 4.6 vol % of the whole fluorescent material comprises a fluorescent material of small particle size of a particle size smaller than 1.371 μm and the remaining 95.6 vol % comprises a fluorescent material of large particle size of a particle size larger than 8.379 μm. The central particle size of the fluorescent material classified using a settling method to have such a particle size distribution is 21.4 μm and the distribution frequency of the above-mentioned central particle size is 29.12%. The particle size of peak of distribution frequency of the fluorescent particles of small particle size is 0.613 μm and the particle size of peak of distribution frequency of the fluorescent particles of large particle size is 22.908 μm. A standard deviation in the particle distribution of the fluorescent particles of large particle size is 0.295.

The fluorescent material, which is adjusted to obtain light of (x, y)=(0.33, 0.33) in a CIE chromaticity diagram and an epoxy resin as a light transmitting resin are mixed at a ratio of 16:100. The resulting epoxy resin containing the fluorescent material is filled by potting in the hollow of the package in which the LED chip is connected to a pair of lead electrode with gold wire and cured to form a light emitting diode.

The light emitting diode fabricated in such a manner can emit white light of a high intensity and output.

Comparative Example 1

Figure 9A:
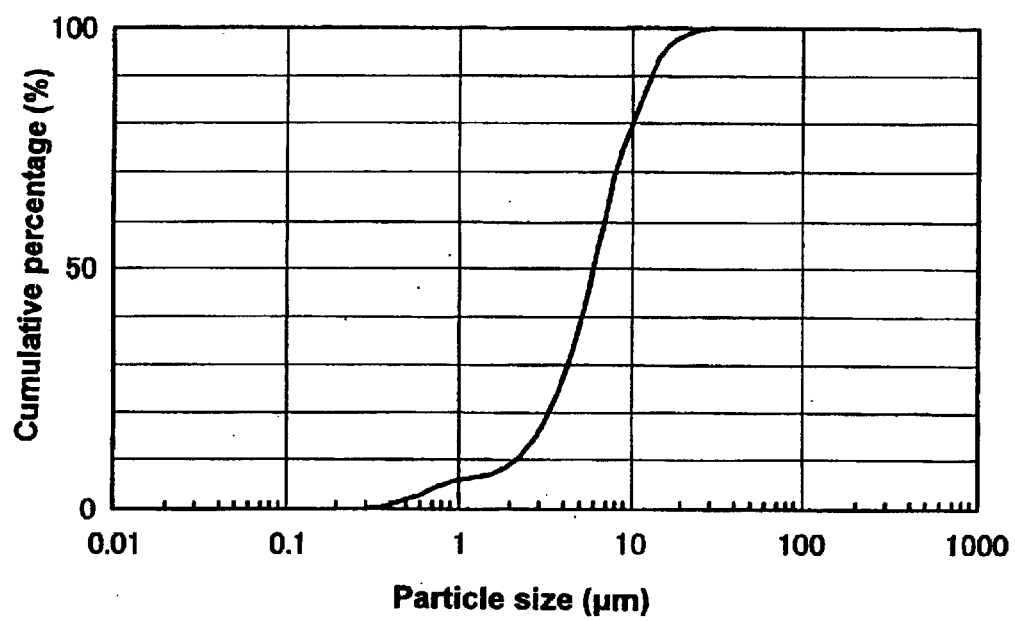
FIG. 9A is a graph showing the volume-based distribution curve (cumulative frequency distribution of particle size) of the fluorescent material of Comparative Example 1.
Figure 9B:
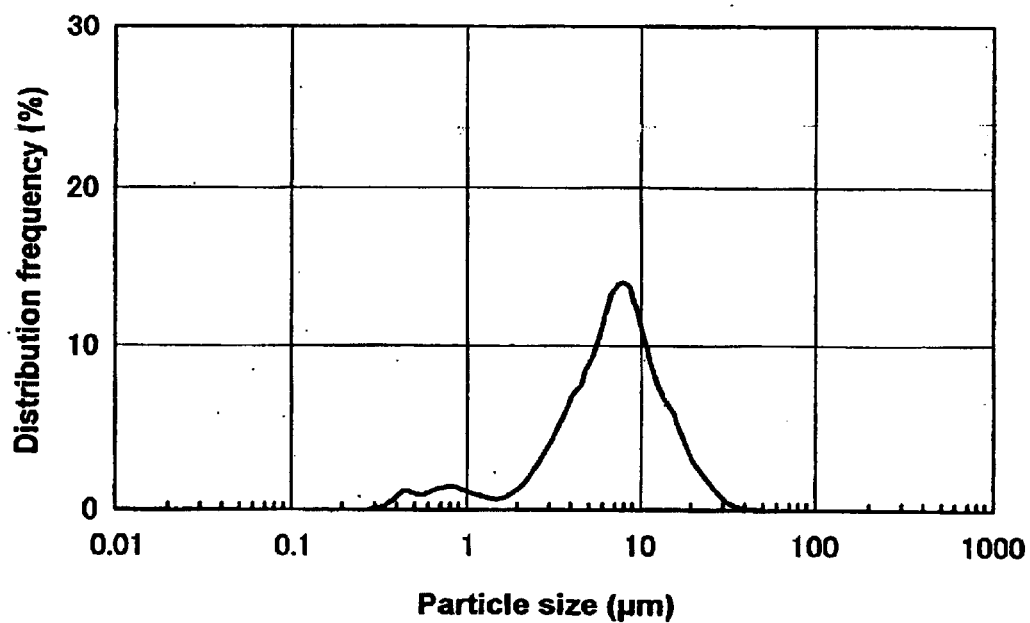
FIG. 9B is a graph showing the volume-based distribution curve (distribution of particle size) of the fluorescent material of Comparative Example 1.

To compare, the light emitting diode having the same chromaticity coordinates is fabricated in the same way as in Example 1, except that $(Y_{0.8}Gd_{0.2})_{2.965}Al_5O_{12}:Ce_{0.035}$ fluorescent material having a wide particle size distribution, of which the curves of volume-based particle size distribution are shown in FIGS. 9A and 9B, and a central particle size of 6.315 μm is used. The luminus intensity and the output of the light emitting diode according to Comparative example 1 are decreased by about 35% and about 25%, respectively, as compared to the light emitting diode of Example 1. This shows that the light emitting diode according to the present invention can emit light of high intensity even in the wavelength range where the chromaticity is low, for example, white light.

A standard deviation in the particle size distribution of the fluorescent material which is used in Comparative Example 1 is 0.365.

EXAMPLE 2

The light emitting diode having the same chromaticity coordinates is fabricated in the same way as in Example 1, except that $(Y_{0.995}Gd_{0.005})_{2.750}Al_5O_{12}:Ce_{0.250}$ fluorescent material is used. This fluorescent material is classified in such a manner that the material has a flat range where the cumulative percentage of particles is 0.077 vol % and the particle size ranges from 1.371 μm to 8.379 μm, the central particle size of the material is 25.626 μm, the distribution frequency of said central particle size is 24.812%, and peak particle sizes of the distribution frequency of the small particle size and large particle size fluorescent particles are 0.613 and 28.012 μm, respectively. The luminous intensity and output of the light emitting diode of Example 2 is enhanced by about 18% and about 10%, respectively, as compared to the light emitting diode of Example 1. Example 2 can provide a light emitting diode having a higher intensity light emitting diode than Example 1.

A standard deviation of the particle size distribution in the fluorescent particles of large particle size is 0.259.

EXAMPLE 3

The light emitting diode having the same chromaticity coordinates is fabricated in the same way as in Example 1, except that the epoxy rein and $SiO_2$ having a central particle size of 2.5 μm as a diffusing agent were mixed at the ratio by weight of 100:50 and thereafter, the same fluorescent material as that of Example 1 was mixed into the epoxy resin containing the diffusing agent. The light emitting diode of Example 3 shows the same intensity and output as those of Example 1. The irregular color can be inhibited and a good color tone can be achieved, as compared to Example 1.

EXAMPLE 4

The light emitting diode having the same chromaticity coordinates is fabricated in the same way as in Example 1, except that the light transmitting resin containing a fluorescent material was provided using a mold on the LED chip which was electrically connected to the substrate, as shown in FIG. 6. The light emitting diode having a smooth light emitting plane can be obtained and shows the similar properties to those of Example 1.

EXAMPLE 5

The light emitting diode having the same chromaticity coordinates is fabricated in the same way as in Example 1, except that the light transmitting resin containing a fluorescent material was formed by means of an intaglio printing method using a mask 39 made of silicone and cured on the substrate to which the LED chip 5 was electrically connected, as shown in FIGS. 7A and 7B. The light emitting diode having a curved light emitting plane can be obtained and shows more even light emission, as compared to Example 1.

There are provided on the substrate 32 positive electrodes 32a and 32b, respectively, in correspondence with each LED chip.

EXAMPLE 6

The epoxy resin and $SiO_2$ having a central particle size of 2.5 μm as a diffusing agent were mixed at the ratio by weight of 100:50 and thereafter, the same fluorescent material as that of Example 2 was mixed into the epoxy resin containing the diffusing agent. Further, $SiO_2$ having a central particle size of 6 μm as a filler is included at the ratio of 70 wt % to the epoxy resin. The resulting material is used as a light transmitting resin. The light transmitting resin was filled in the hollow of the cabinet having a wall on which the LED chip is electrically connected to a pair of lead electrodes with gold wire using an intaglio printing method in the same manner as in Example 5. And then, the resin was cured at 85° C. for 3 hours and further, at 140° C. for 4 hours to fabricate a light emitting diode having the same chromaticity coordinates as in Example 1. The light emitting diode of Example 6 has a longer lifetime and emits even light.

EXAMPLE 7

The light emitting diode is fabricated in the same way as in Example 3, except that the fluorescent material similar to that of Example 2 and $SiO_2$ having a central particle size of about 25 μm which is similar to that of said fluorescent material, as a filler are used. The luminous intensity of the resulting light emitting diode is increased by 10%, as compared to that of Example 3.

EXAMPLE 8

The light emitting diode is fabricated in the same way as in Example 6, except that the fluorescent material similar to that of Example 2 and $SiO_2$ having a roundness which is different by 10% from that of said fluorescent material and a central particle size of about 25 μm which is similar to that of said fluorescent material, as a filler are used. The luminous intensity of the resulting light emitting diode is increased by 10%, as compared to that of Example 6.

EXAMPLE 9

Figure 10A:
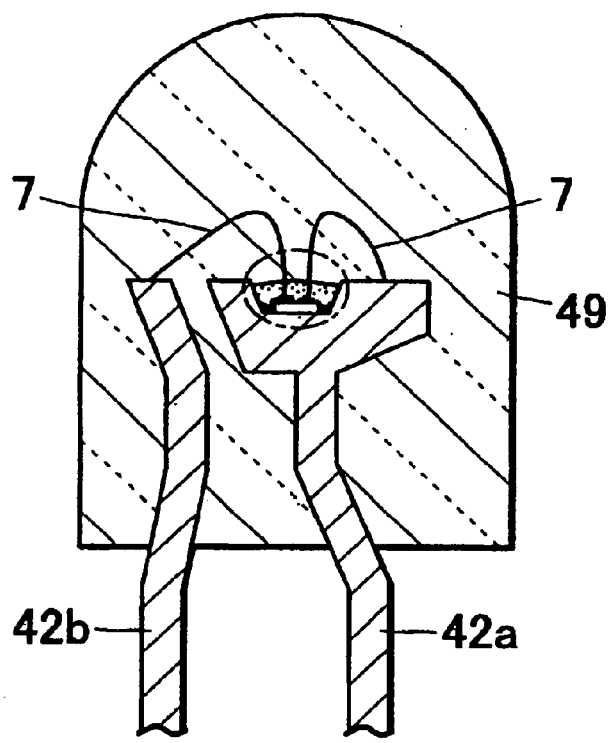
FIG. 10A is a schematic sectional view of a lamp type light emitting diode according to Example 9 of the present invention.
Figure 10B:
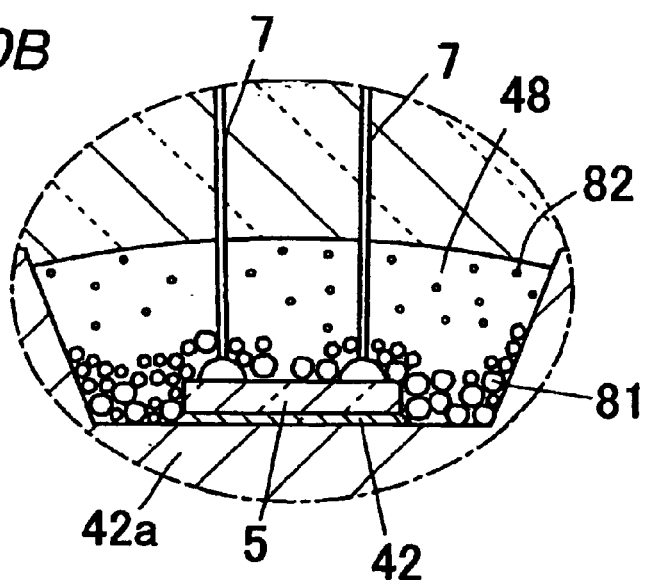
FIG. 10B is an enlarged view of a portion in the dashed circle in FIG. 10A.

As shown in FIG. 10A and FIG. 10B which is a partial enlarged view of FIG. 10A, the LED chip 5 (similar to that of Example 1) is die-bonded with epoxy resin 42 to the cup portion of the mount lead 42a made of bright plated copper and thereafter, each electrode of the LED chip 5 and the mount lead 42a and the second lead 42b are wire-bonded, respectively, using a wire 7 having a diameter of 30 μm. The mixture of the fluorescent material similar to that of Example 2, which is adjusted to obtain light of (x, y)=(0.33, 0.33) in a CIE chromaticity diagram and an epoxy resin as a light transmitting resin at a ratio by weight of 5:100 is filled in the cup of said mount lead and then, cured at 150° C. for 1 hour to form a coating part containing a fluorescent material. Further, a cannonball type lens 49 is formed using the transparent epoxy resin, so as to obtain a round shape in view of light emitting observation plane. The resulting lamp type light emitting diode has effects similar to those of Example 1.

EXAMPLE 10

The lamp type light emitting diode is fabricated in the same way as in Example 9, except that the fluorescent material similar to that of Example 2, the epoxy resin which is a light transmitting resin and $SiO_2$ having a roundness which is different by 10% from that of said fluorescent material and a central particle size of about 25 μm as a filler are mixed at a ratio by weight of 100:10:35 and the resulting mixture is filled in the cup of the mount lead. Brighter and more even light is emitted, as compared to Example 9.

EXAMPLE 11

The LED chip similar to that of Example 1 is placed in the hollow of the resin package into which the lead electrode is inserted. The silicone resin which is a light transmitting resin, the fluorescent material similar to that of Example 1, the fluorescent material composed $Y_{2.965}Al_5O_{12}:Ce_{0.035}$ having a central particle size of 13 μm and $SiO_2$ having a central particle size of about 0.5 μm are mixed at a ratio by weight of 100:0.69:0.5:10 and the resulting mixing solution is filled in said hollow, so as to fabricate a light emitting diode. The resulting light emitting diode has effects similar to those of Example 1, a good color rendering and a high brightness.

EXAMPLE 12

The light emitting diode is fabricated in the same way as in Example 11, except that the silicone resin which is a light transmitting resin, $(Y_{0.9}Gd_{0.1})_{2.965}Al_5O_{12}:Ce_{0.035}$ having a central particle size of 30 μm, the fluorescent material similar to that of Example 2, and SiO$_2$ having a central particle size of about 0.5 μm are mixed at a ratio by weight of 100:0.69:0.5:10 and the resulting mixing solution is filled in said hollow. The resulting light emitting diode has effects similar to those of Example 2, a good color rendering and a high brightness.

EXAMPLE 13

Example 13 is an example of a producing method according to the first embodiment.

In Example 13, the surface-mounted type of light emitting diode as shown in FIG. 1 is fabricated.

In Example 13, the LED chip 5 is a nitride semiconductor LED chip comprising a light emitting layer made of In$_{0.2}$Ga$_{0.8}$N which has a monochromic light emitting peak of 475 nm in the visible region. More specifically, the LED chip 5 is fabricated by forming nitride semiconductor layers on the cleaned sapphire substrate using a TMG (trimethylgallium) gas, a TMI (trimethylindium) gas, a nitrogen gas and a dopant gas with a carrier gas, by means of MOCVD method. In this case, the n-type nitride semiconductor and p-type nitride semiconductor layers are formed, respectively, by using SiH$_4$ and Cp$_2$Mg as a dopant gas.

The LED chip 5 comprises a buffer layer made of GaN which is grown at a low temperature, an n-type GaN layer which is an undoped nitride semiconductor, a Si-doped GaN layer (n-type contact layer) on which an n-electrode is formed, a light emitting layer in the multi quantum well structure in which one group consisting of the GaN layer as a barrier layer, the InGaN layer as an well layer and the GaN layer as a barrier layer is sandwiched between the GaN layers, a Mg-doped AlGaN layer (p-type cladding layer),and a Mg-doped GaN layer (p-type contact layer), which are sequentially formed, on the sapphire substrate.

The p-type semiconductor is annealed at the temperature of 400° C. or more after forming layers.

After forming layers, each of p-type and n-type contact layers is exposed by etching on the same surface side of the nitride semiconductor on the sapphire substrate. The positive and negative electrodes are formed on each contact layer, respectively, by sputtering. The metal thin film is formed as a translucent electrode on the entire surface of the p-type nitride semiconductor and thereafter, the basic electrode is formed on a part of the translucent electrode. The resulting wafer is scribed and cut by eternal forces into LED chips which are light emitting devices.

The LED chip fabricated in the above-mentioned way is die-bonded with an epoxy resin into each via hole of the package assembly which has been described in the first embodiment. Each electrode of the LED chip is electrically connected to the metal films 2a and 2b, respectively by wire bonding using gold wire.

The fluorescent material is fabricated as follow.

Rare earth elements, Y, Gd and Ce, are dissolved in an acid at a ratio of stoichiometry and the resulting solution is coprecipitated with oxalic acid. The resulting coprecipitate is calcined and the obtained oxide of coprecipitate and aluminum oxide are mixed. The resulting mixture as a flux is mixed with barium fluoride and filled into the crucible and then, heated at 1400° C. for 3 hours in the air to obtain a burned product. The burned product is ground in water with a ball mill and washed, separated, dried and then, at last, combed to form (Y$_{0.995}$Gd$_{0.005}$)$_{2.750}$Al$_5$O$_{12}$:Ce$_{0.250}$ fluorescent material.

An alicyclic epoxy resin composite (viscosity 8000 mPa·s) obtained by mixing and dispersing 17 wt % of said fluorescent material and 70 wt % of SiO$_2$ having a central particle size of 10 μm into the epoxy resin containing 20 wt % of SiO$_2$ having a central particle size of 0.3 μm is used as a material for sealing members.

In this Example 13, the mask 112 made of stainless steel and having a thickness of 100 μm is used. The mask design is the same as in FIG. 3 that is described in the first embodiment. The package assembly on which the LED chip is located is inhaled to the mask 112 with the stage for elevating the substrate mounted in such a way that the opening side of the via hole is aimed at the mask 112, to make contact with the mask 112.

Said light transmitting resin is applied to the end of the mask 112 in a predetermined amount required for printing and the pressure is reduced to 330 Pa. After the completion of decompression, an air pressure of 0.10 Mpa is applied to the knife 14 inclined at 30° in the operating direction with respect to the perpendicular line of the mask 112 to run the squeegee in one direction. Next, the inside of the chamber is pressurized to 20000 Pa. After completion of compression, an air pressure of 0.12 Mpa is applied to the knife 15 inclined at 35° in the direction opposite to said squeegee with respect to the perpendicular line of the mask 112 to run the squeegee in the other direction. This reciprocating squeegee is repeated twice.

Next, the stage for elevating the substrate is lowered to separate the package assembly from the mask 112. Then, the light transmitting resin is primarily cured at 85° C. for 3 hours and secondarily cured at 140° C. for 4 hours. In this way, the light transmitting resin having an smooth surface is formed over the via hole and the insulating substrate on either side thereof.

Next, to the ultraviolet radiation cured dicing adhesive sheet having a thickness of 150 μm and comprising an adhesive layer of 20 μm in thickness is attached the package assembly with the light transmitting resin side of the assembly opposite to the adhesive layer. The package assembly and the dicing adhesive sheet are cut into the depth of 100 μm using a dicing blade from the bottom of the package assembly to cut away respective light emitting diodes. Finally, the ultraviolet radiation is applied to the package assembly from the film side to cure the adhesive layer and then the assembly is cut away into each light emitting diode. When 500 of the surface-mounted diode type (SMD type) light emitting diodes obtained in this way were tested for variations, it has been shown that variations in chromaticity are small among different light emitting diodes and that visually, there is no unevenness in emitted light in each light emitting diode.

Comparative Example

The light emitting diode is fabricated in the same way as in Example 13, except that the mask formed in such a way that one opening corresponds to one via hole of the package assembly is used. The light transmitting resin filled in the top surface of the resulting light emitting diode leaks on the top surface of substrate on each side. The resulting light emitting diode is adhered to the adhesive sheet for dicing and cut away, each light emitting diode comes apart.

When 500 of the resulting light emitting diodes are observed, there are burrs on the top surface, as compared to Example 1. Where 500 of light emitting diodes were implemented, variations in color temperature during producing were examined. Variations in color temperature during producing for the light emitting diodes of Example 13 were reduced by about 20%, as compared to the area on the chromaticity diagram for the light emitting diodes of Comparative example.

EXAMPLE 14

The surface-mounted light emitting diode is fabricated in the same way as in Example 13, except that an alicyclic epoxy resin composite (viscosity: 15000 mPa·s) obtained by mixing and dispersing 15 wt % of the above-mentioned fluorescent material and 40 wt % of $SiO_2$ having a central particle size of 10 μm into the undoped one-liquid-cured epoxy resin including a bridged oligomer is used as a material for a sealing member. The luminous intensity and output are increased, as compared to Example 13. Moreover, the reliability can be improved dramatically.

In Example 15, $(Y_{0.8}Gd_{0.2})_{2.965}Al_5Gd_{12}:Ce_{0.035}$ in which about 20 percent of Y is substituted with Gd and which has a central particle size of 21.429 μm is prepared in the same way as in Example 13. The fluorescent material is composed of a fluorescent material of large particle size and a fluorescent material of small particle size. In the flat range having a slope of zero in the curve of the volume-based particle size distribution, the cumulative percentage of particles is 4.6 vol % and the particle size ranges from 1.371 μm to 8.379 μm. That is, 4.6 vol % of the whole fluorescent material comprises fluorescent particles of small particle size smaller than 1.371 μm and the remaining 95.6 vol % comprises fluorescent particles of large particle size larger than 8.379 μm. The central particle size of the fluorescent material classified using a settling method to have such a particle size distribution is 21.4 μm and the frequency of the above-mentioned central particle size is 29.12%. The particle size of peak of distribution frequency of the fluorescent particles of small particle size is 0.613 μm and the particle size of peak of distribution frequency of the fluorescent particles of large particle size is 22.908 μm. Where the fluorescent material having such a particle size distribution is used, the luminous intensity and light emitting output can be enhanced.

In example 15, the surface-mounted type light emitting diode is fabricated in the same way as in Example 14, except that 15 wt % of the above-mentioned fluorescent material is added to the resin composite. The light emitting diode of Example 15 can achieve an effect similar to that of Example 14. The brightness of the light emitting diode of Example 15 is higher than that of Example 14.

EXAMPLE 16

Four kinds of resins C, D, E and F, which were epoxy resins according to the present invention, and the resins A and B of Comparative example were prepared and the characteristics thereof were examined.

1. Preparation of the Epoxy Resin Composite

The epoxy resin composites A to F were prepared under the following conditions. Where acid anhydride was added, the conversion ratio of a carboxyl group to an ester group was estimated. The ester conversion ratio is the ratio, expressed as a molar percentage, of the carboxyl groups included in the acid anhydride, which have been converted into ester groups. The ester conversion ratio was examined using a neutralization reaction with KOH solution. Specifically, 1.00 g of the epoxy resin was dissolved in 50 mL of ethanol and 0.1 N KOH solution in water was added. At the point of neutralization, the color of the BTB indicator turned from yellow into blue (at pH 7.6). The amount of carboxyl groups which were not converted into ester groups was determined using the mount of KOH solution in water required for neutralization.

Resin A: Comparative Example 256 g (1.95e.eq)g of 3'4'-epoxy-cyclohexylmethyl 3,4-epoxy-cyclohexanecarboxylate, which is a derivative of cyclohexene epoxidated compound as an alicyclic epoxy resin and 0.6 g of Benzyl p-hydroxyphenyl methylsulfonium Hexafluoroantimonate, which is an aromatic sulfonium salt (anion species is hexafluoroantimony) and a benzylsulfonium-based catalyst, as a cationic curing agent, were put in the 300 mL four neck flask. The resulting mixture was stirred for 0.5 hour and heated at 85° C. for 3 hours and further at 140° C. for 4 hours to be cured.

Resin B: Comparative Example 7.68 g of propylene glycol monoglycidyl ether is added (3 wt % with respect to the epoxy resin) as a reactive diluent was added to the component of resin A. The resulting mixture was stirred for 0.5 hour and heated at 85° C. for 3 hours and further at 140° C. for 4 hours to be cured.

Resin C: Present Invention 256 g (1.95e.eq) of 3'4'-epoxy-cyclohexylmethyl 3,4-epoxy-cyclohexanecarboxylate as an alicyclic epoxy resin, 104.29 g ($6.09 \times 10^{-1}$ mol) of the mixture of 4-methylhexahydrophthalic anhydrate/hexahydrophthalic anhydrate at a ratio of 70/30, 2.56 g ($4.12 \times 10^{-2}$ mol) of ethylene glycol as a promoter and 0.6 g of Benzyl p-hydroxyphenyl methylsulfonium Hexafluoroantimonate, which is a benzylsulfonium-based catalyst, as a cationic curing agent, were put in the 300 mL four neck flask. The resulting mixture was stirred for 0.5 hour and the ester conversion ratio was measured to be 0%. After measurement, the mixture was heated at 85° C. for 3 hours and further at 140° C. for 4 hours to be cured.

Resin D: Present Invention 256 (1.95e.eq) g of 3'4'-epoxy-cyclohexylmethyl 3,4-epoxy-cyclohexanecarboxylate as an alicyclic epoxy resin, 9.57 g ($5.69 \times 10^{-2}$ mol) of the mixture of 4-methylhexahydrophthalic anhydrate/hexahydrophthalic anhydrate at a ratio of 70/30 and 1.77 g ($2.85 \times 10^{-2}$ mol) of ethylene glycol as a promoter were put in the 300 mL four neck flask and the temperature was increased slowly with a multiheater and maintained at 90 to 100° C. for 16 hours. The temperature was decreased slowly to room temperature. Then, 0.6 g of Benzyl p-hydroxyphenyl methylsulfonium Hexafluoroantimonate, which is a benzylsulfonium-based catalyst, as a cationic curing agent, was added. The resulting mixture was stirred for 0.5 hour and the conversion ratio of the carboxyl group into the ester group was measured to be 90.6%. After measurement, the mixture was heated at 85° C. for 3 hours and further at 140° C. for 4 hours to be cured.

Resin E: Present Invention

The epoxy resin composite was prepared in the same way as resin D, except that 256 g (1.95e.eq) of 3'4'-epoxy-cyclohexylmethyl 3,4-epoxy-cyclohexanecarboxylate as an alicyclic epoxy resin, 15.95 g ($9.48 \times 10^{-2}$ mol) of the mixture of 4-methylhexahydrophthalic anhydrate/hexahydrophthalic anhydrate at a ratio of 70/30, 2.95 g ($4.75 \times 10^{-2}$ mol) of ethylene glycol as a promoter and 0.6 g of Benzyl p-hydroxyphenyl methylsulfonium Hexafluoroantimonate, which is a benzylsulfonium-based catalyst, as a cationic curing agent, were used. The ester conversion ratio of the carboxyl group into the ester group was measured to be 94.2%.

Resin F: Present Invention

The epoxy resin composite was prepared in the same way as resin D, except that 256 g (1.95e.eq) of 3'4'-epoxycyclohexylmethyl 3,4-epoxy-cyclohexanecarboxylate as an alicyclic epoxy resin, 25.52 g ($1.52\times10^{-1}$ mol) of the mixture of 4-methylhexahydrophthalic anhydrate/hexahydrophthalic anhydrate at a ratio of 70/30, 4.72 g ($7.60\times10^{-2}$ mol) of ethylene glycol as a promoter and 0.6 g of Benzyl p-hydroxyphenyl methylsulfonium Hexafluoroantimonate, which is a benzylsulfonium-based catalyst, as a cationic curing agent, were used. The ester conversion ratio of the carboxyl group into the ester group was measured to be 92.4%.

2. Flexibility Examination

The light emitting diode as shown in FIG. 1 was fabricated using the epoxy resin composites A to F and the impact test in liquid phase was carried out to evaluate flexibility of the resin.

No fluorescent material was mixed into the epoxy resin composite of the light emitting diode used for this examination.

In this impact test in liquid phase, the cycle consisting of dipping in the liquid phase of −40° C. for one minute and dipping in the liquid phase of 100° C. for one minute was repeated 500 to 2500 cycles and then, the number of the occurrence of cracks into the LED chip or of malfunction due to wire open was examined (test samples: 100).

The examination results are shown in table 1. For the resin A obtained by curing the alicyclic epoxy resin only with a cationic curing agent, the malfunction due to cracks occurred since the initial stage of the test and the ratio of malfunction reached 100% after 1000 cycles. For the resin B of which the flexibility was enhanced by adding a reactive diluent, 7% of malfunction occurred after 2500 cycles. On the other hand, for any resins C, D, E and F according to the present invention, the ratio of the occurrence of malfunction was not more than 4% after 2500 cycles. Particularly, for the resins D, E and F in which the conversion into ester was advanced, the occurrence ratio of malfunction was 0%. It was confirmed that he epoxy resin composite of the present invention has a more excellent flexibility than that of the conventional epoxy resin of which the flexibility is enhanced using a reactive diluent.

TABLE 1

| | Occurrence ratio of malfunction | | | | | |
|---|---|---|---|---|---|---|
| | 500 cycle | 1000 cycle | 1500 cycle | 2000 cycle | 2500 cycle | Cause of malfunction |
| Resin A: Comparative example | 39% | 100% | 100% | 100% | 100% | crack |
| Resin B: Comparative example | 0% | 0% | 1% | 4% | 7% | crack |
| Resin C: example | 1% | 1% | 3% | 3% | 4% | crack |
| Resin D: example | 0% | 0% | 0% | 0% | 0% | — |
| Resin E: example | 0% | 0% | 0% | 0% | 0% | — |
| Resin F: example | 0% | 0% | 0% | 0% | 0% | — |

3. Light Resistance (Yellowing) Examination

Figure 11A:
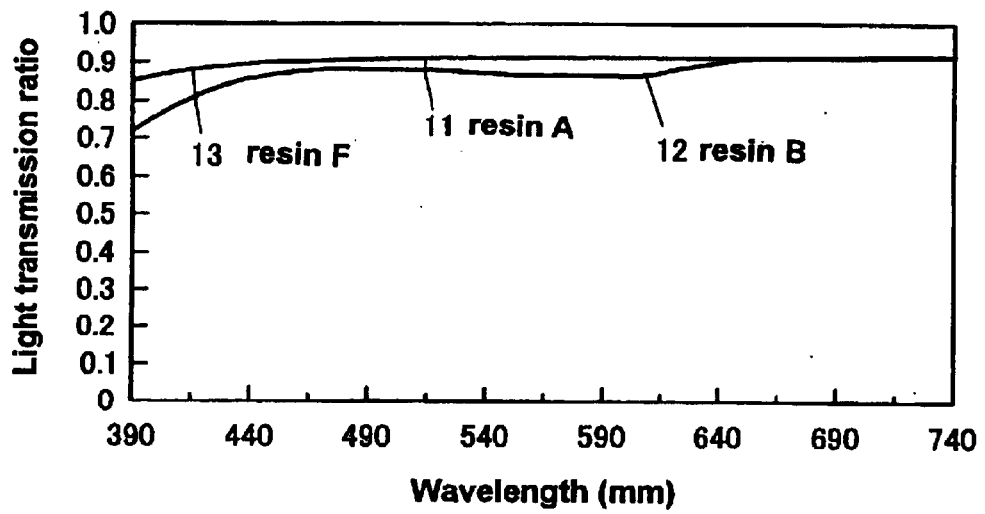
FIG. 11A is a graph showing light transmission ratio of epoxy resin composition before light resistance test.
Figure 11B:
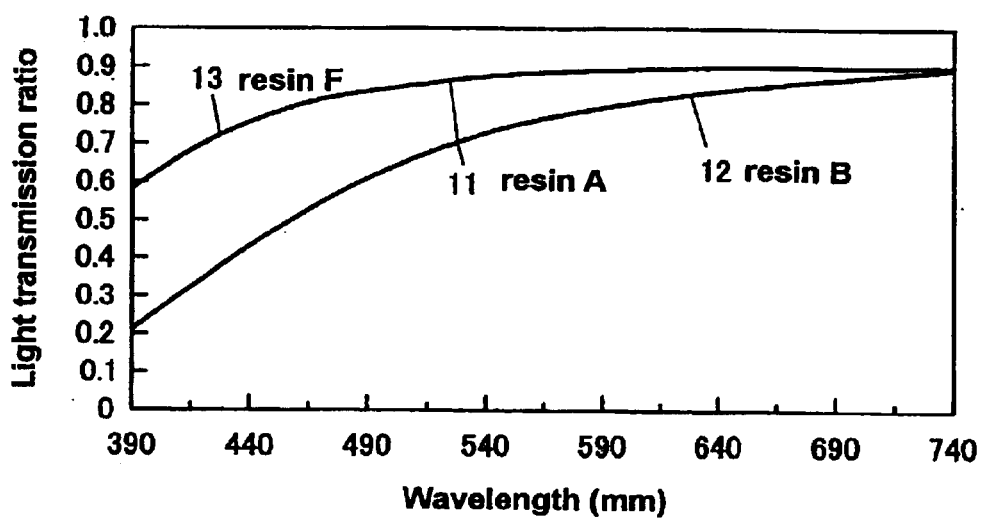
FIG. 11B is a graph showing light transmission ratio of epoxy resin composition after light resistance test.

The light resistance test was carried out using the epoxy resins B and F. The test piece of 30×30×3 mm was fabricated and radiated with a xenon lamp for 100 hours at 120° C. to examine the change in overall transmittance of beam before and after the radiation. The transmittance was measured with a spectroscopic calorimeter (made by Murakami Color Lab.). The examination results are shown in FIGS. 11A and 11B. FIG. 11A shows the overall transmittance of beam before radiation and FIG. 11B shows the overall transmittance of beam after radiation. For the resin B, a conventional epoxy resin composite to which a reactive diluent was added, the transmittance in the range of a short wavelength decreased and the color was changed into yellow in the early stage. The transmittance further decreased in the range of a short wavelength and the yellowing was advanced remarkably during the light resistance test.

On the other hand, for the resin F, an epoxy resin composite of the present invention, no coloring was observed in the early stage and after the light resistance test.

4. Heat Resistance Examination

Figure 12A:
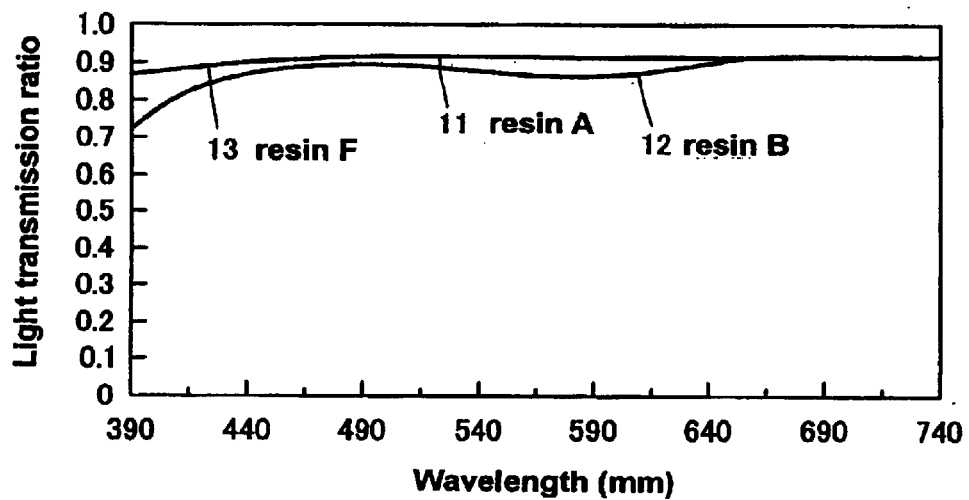
FIG. 12A is a graph showing light transmission ratio of epoxy resin composition before thermal stability test.
Figure 12B:
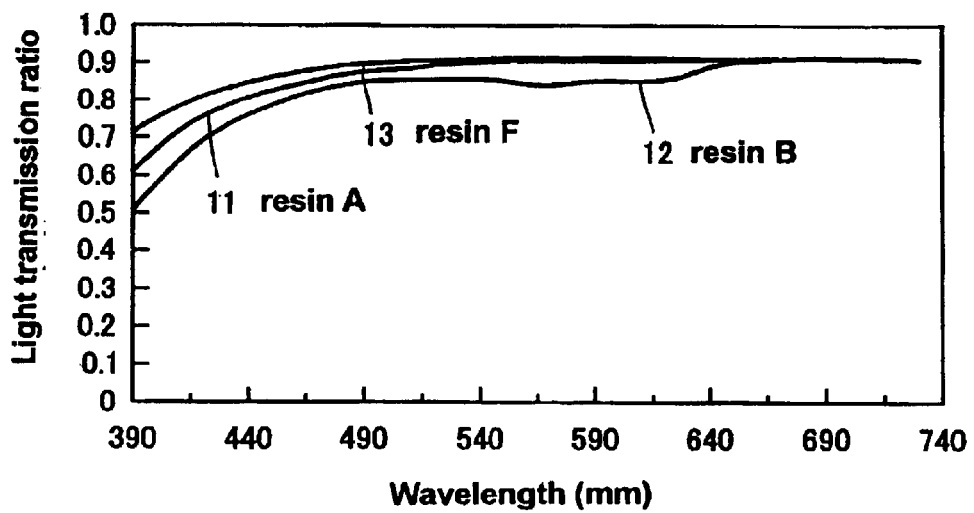
FIG. 12B is a graph showing light transmission ratio of epoxy resin composition after thermal stability test.

The heat resistance test was carried out using the epoxy resins A, B and F. The test piece of 30×30×3 mm was fabricated and heated at 120° C. for 500 hours in an oven to examine the change in overall transmittance of beam before and after the heating. The transmittance was measured with a spectroscopic calorimeter (made by Murakami Color Lab.). The examination results are shown in FIGS. 12A and 12B. FIG. 12A shows the overall transmittance of beam before heating and FIG. 12B shows the overall transmittance of beam after heating.

The resin A, a conventional epoxy resin composite to which a cationic curing agent was added, showed a transmittance similar to that of the resin F, an epoxy resin composite of the present invention, in the early stage. But for the resin A, the transmittance in the range of a short wavelength decreased and the color was changed into yellow during the heat resistance test.

For the resin B, a conventional epoxy resin composite to which a reactive diluent was added, the transmittance in the range of a short wavelength decreased and the color was changed into yellow in the early stage. The transmittance further decreased in the range of a short wavelength and the yellowing was advanced remarkably during the light resistance test.

On the other hand, for the resin F, an epoxy resin composite of the present invention, no coloring was observed in the early stage and the yellowing was advanced during the heat resistance test, but the heat resistance was better than that of resin B.

5. LED Current Passed Life Examination

Figure 13:
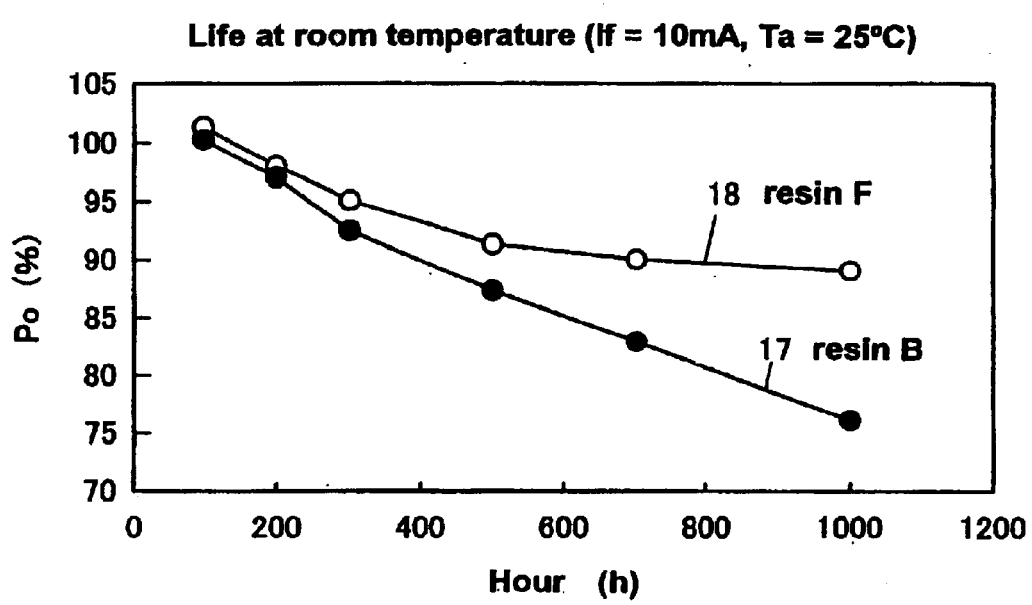
FIG. 13 is a graph showing the variation in the output intensity of a light emitting diode using epoxy resin composition as the molding resin, measured in service life test at a normal temperature.
Figure 14:
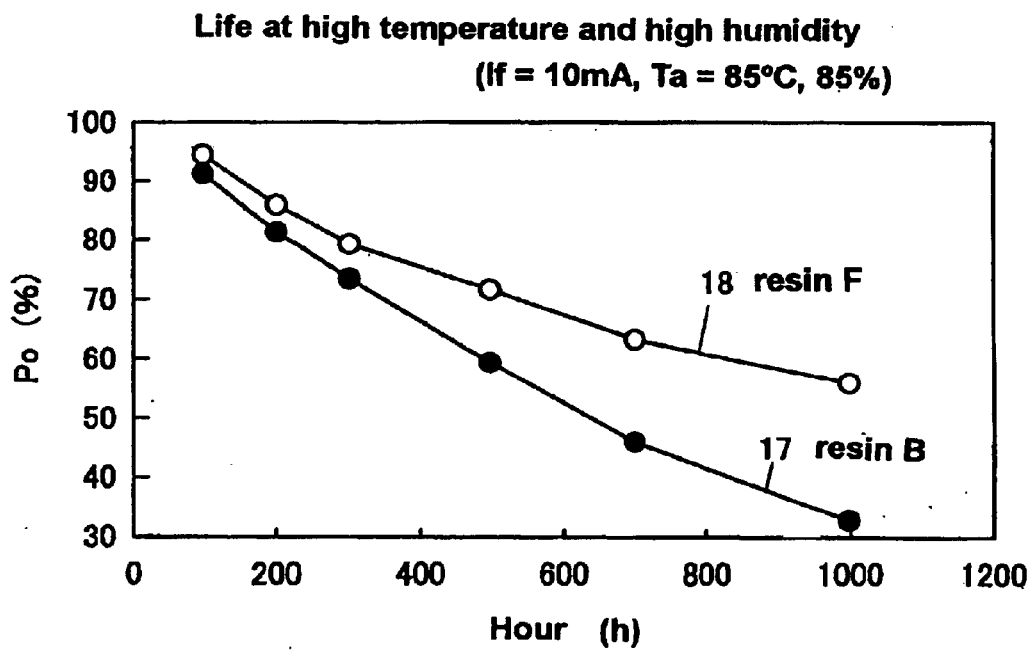
FIG. 14 is a graph showing the variation in the output intensity of a light emitting diode using epoxy resin composition as the molding resin, measured in a high temperature and high humidity life test.

The light emitting diode having a structure as shown in FIG. 1 was fabricated using epoxy resin composites B and F and the current passed life test (current: 10 mA) was carried out at room temperature (25° C.) and at an elevated temperature and a high humidity(85° C., 85%). FIGS. 13 and 14 are graphs showing changes in relative outputs $P_0\%$ (the relative value of outputs where the output in the early stage is 100%) of LED during the current passed life test at room temperature and at an elevated temperature and a high humidity, respectively. As shown in FIGS. 13 and 14, for the epoxy resin composite of the present invention, the reduction of the LED output during life was smaller than that of the conventional epoxy resin composite B.

6. Pot Life Examination

The change in viscosity over time was examined at 50° C. using the epoxy resin composites B and F. The examination results are shown in FIG. 15. The conventional epoxy resin composite B had a pot life of about 25 hours, while the epoxy resin composite of the present invention F had a pot life of about 40 hours.

EXAMPLE 17

The surface-mounted type light emitting diode as shown in FIG. 1 was fabricated. In this light emitting diode of Example 17, a fluorescent material was mixed with the light transmitting resin. The LED chip 5 comprises a nitride semiconductor device including a light emitting layer made of $In_{0.2}Ga_{0.8}N$ semiconductor having a monochromic emission peak of 475 nm in the visible range. That is, the same LED chip as that of Example 13 was used.

The package used was also the same as that of Example 13.

The fluorescent material used was also the same as that of Example 13.

To the above-mentioned resin F, 15 wt % of said fluorescent material and 40 wt % of $SiO_2$ having a central particle size of 10 μm were mixed and dispersed to obtain an alicyclic epoxy resin composite (viscosity: 15000 mPa·s) as a light transmitting resin.

500 light emitting diodes were fabricated in the same way as in Example 13.

The variations among 500 light emitting diodes fabricated in this way were examined. It was shown that variations in chromaticity among the light emitting diodes were small and there was no visual emission unevenness in each light emitting diode. The reliability could be enhanced extremely, as compared to the diode using the resin A.

Comparative Example

The light emitting diode was fabricated in the same way as in Example 17, except that the resin A and the mask having an opening corresponding to one via hole in the insulating substrate were used. The emission unevenness was observed and the even emission could not be achieved. The reliability decreased, as compared to Example 17.

EXAMPLE 18

The light emitting diode was fabricated in the same way as in Example 17, except that the same fluorescent material as that of Example 15 was used and 15 wt % of the fluorescent material was included into the resin F. The light emitting diode of Example 18 showed effects similar to those of Example 1 and had a higher brightness than that in Example 17.

The following examples will describe the synthesis of the fluorescent material.

EXAMPLE 19

The Synthesis of the Fluorescent Material by Means of a Two-step Calcination Method in Reducing Atmospheres The following examples relate to the method of the fluorescent material suited for the light emitting diode.

According to the method of Example 19, a flux is mixed into the mixture material which has been adjusted to achieve the composition of the fluorescent material and the resulting mixed is filled in the crucible and calcined at 1400° C. to 1600° C. for 6 to 8 hours in the weakly reducing atmosphere and further, at 1400° C. to 1600° C. for 6 to 8 hours in the reducing atmosphere. The resulting calcination product is ground and passed through a comb of 200 mesh to form a fluorescent material.

In this way, the mixture consisting of the mixed raw material and the flux is calcined using a two-step calcination method comprising the first calcination step in the weakly reducing atmosphere and the second calcination step in the reducing atmosphere, so as to obtain a fluorescent material having a high absorbing efficiency of the excitation wavelength. Therefore, where the resulting fluorescent material is applied to the light emitting diode as shown in FIG. 1, the amount of the fluorescent material required to obtain the desired tone can be reduced and the light emitting diode having a high efficiency of light extraction can be achieved.

EXAMPLE 20

Oxides of Each Raw Material are Mixed at a Stoichiometric Ratio. Flux:Aluminum Fluoride First, the mixture material is obtained by mixing $Y_2O_3$, $Gd_2O_3$, $Al_2O_3$ and $CeO_2$ at a stoichiometric ratio. To the resulting mixture material, aluminum fluoride is added as a flux and mixed with a ball mill mixer for 2 hours. Next, after removing the ball, the resulting mixture is fired at 1400 to 1600° C. for 6 to 8 hours in a weakly reducing atmosphere and further at 1400 to 1600° C. for 6 to 8 hours in a reducing atmosphere. The resulting firing product is ground and passed through a comb of 200 mesh to form a fluorescent material. Where the resulting fluorescent material is irradiated with an exciting light in the blue range, the fluorescent material emits light of (x, y)=(0.457, 0.527) in chromaticity coordinates (JISZ8110). For example, where this fluorescent material is used for the light emitting diode as shown in FIG. 1, the similar results to those of Example 19 can be achieved.

EXAMPLE 21

Barium Fluoride+Boric Acid is used as a Flux in Example 20

First, the mixture material is obtained by mixing $Y_2O_3$, $Gd_2O_3$, $Al_2O_3$ and $CeO_2$ at a stoichiometric ratio. To the resulting mixture material, barium fluoride+boric acid is added as a flux and mixed with a ball mill mixer for 2 hours. Next, after removing the ball, the resulting mixture is calcined at 1400 to 1600° C. for 6 to 8 hours in a weakly reducing atmosphere and further at 1400 to 1600° C. for 6 to 8 hours in a reducing atmosphere. The resulting calcination product is ground and passed through a comb of 200 mesh to form a fluorescent material. Where the resulting fluorescent material is irradiated with an exciting light in the blue range, the fluorescent material emits light of (x, y)=(0.454, 0.531) in chromaticity coordinates (JISZ8110).

The fluorescent material formed using barium fluoride as a flux has a longer y value of chromaticity and a smaller amount of red component, a compared to the material using other substances as a flux.

For example, where this fluorescent material is used for the light emitting diode as shown in FIG. 1, the similar results to those of Example 19 can be achieved.

EXAMPLE 22

10 wt % of a Liquid is Added During Calcination in Example 21

First, the mixture material is obtained by mixing $Y_2O_3$, $Gd_2O_3$, $Al_2O_3$ and $CeO_2$ at a stoichiometric ratio. To the resulting mixture material, barium fluoride+boric acid is added as a flux and mixed with a ball mill mixer for 2 hours. Next, after removing the ball, 10 wt % of a liquid such as pure water with respect to the resulting powder is added and the resulting mixture is calcined at 1400 to 1600° C. for 6 to 8 hours in a weakly reducing atmosphere and further at 1400 to 1600° C. for 6 to 8 hours in a reducing atmosphere. The resulting calcination product is ground and passed through a comb of 200 mesh to form a fluorescent material. Where the resulting fluorescent material is irradiated with an exciting light in the blue range, the fluorescent material emits light of (x, y)=(0.455, 0.530) in chromaticity coordinates (JISZ8110).

For example, where this fluorescent material is used for the light emitting diode as shown in FIG. 1, the similar results to those of Example 19 can be achieved.

EXAMPLE 23

37.5 wt % of a Liquid is added During Calcination in Example 21

First, the mixture material is obtained by mixing $Y_2O_3$, $Gd_2O_3$, $Al_2O_3$ and $CeO_2$ at a stoichiometric ratio. To the resulting mixture material, barium fluoride+boric acid is added as a flux and mixed with a ball mill mixer for 2 hours. Next, after removing the ball, 37.5 wt % of a liquid such as pure water with respect to the resulting powder is added and the resulting mixture is calcined at 1400 to 1600° C. for 6 to 8 hours in a weakly reducing atmosphere and further at 1400 to 1600° C. for 6 to 8 hours in a reducing atmosphere. The resulting calcination product is ground and passed through a comb of 200 mesh to form a fluorescent material. Where the resulting fluorescent material is irradiated with an exciting light in the blue range, the fluorescent material emits light of (x, y)=(0.458, 0.528) in chromaticity coordinates (JISZ8110).

For example, where this fluorescent material is used for the light emitting diode as shown in FIG. 1, the similar results to those of Example 19 can be achieved.

EXAMPLE 24

62 wt % of a Liquid is Added During Calcination in Example 21

First, the mixture material is obtained by mixing $Y_2O_3$, $Gd_2O_3$, $Al_2O_3$ and $CeO_2$ at a stoichiometric ratio. To the resulting mixture material, barium fluoride+boric acid is added as a flux and mixed with a ball mill mixer for 2 hours. Next, after removing the ball, 62 wt % of a liquid such as pure water with respect to the resulting powder is added and the resulting mixture is calcined at 1400 to 1600° C. for 6 to 8 hours in a weakly reducing atmosphere and further at 1400 to 1600° C. for 6 to 8 hours in a reducing atmosphere. The resulting calcination product is ground and passed through a comb of 200 mesh to form a fluorescent material. Where the resulting fluorescent material is irradiated with an exciting light in the blue range, the fluorescent material emits light of (x, y)=(0.461, 0.526) in chromaticity coordinates (JISZ8110).

For example, where this fluorescent material is used for the light emitting diode as shown in FIG. 1, the similar results to those of Example 19 can be achieved.

Industrial Applicability

The present invention can provide the light emitting diode having a less irregular color, good reliability, good productivity, and high utility value.

What is claimed is:

1. An epoxy resin composition comprising:

an epoxy resin comprising an alicyclic epoxy resin in an amount of 65% by weight or more of the epoxy resin, an acid anhydride represented by the general formula (1) or dicarboxylic acid represented by the general formula (2) in an amount of 0.005 to 1.5 mol based on an epoxy equivalent of the epoxy resin, and a cation curing agent in an amount of 0.0001 to 0.01 mol based on an epoxy equivalent of said epoxy resin

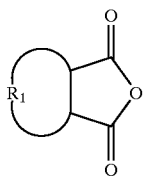

(1)

-continued

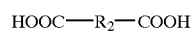

(2)

wherein $R_1$ represents a cyclic or aliphatic alkyl, or a cyclic or aliphatic aryl, said $R_1$ having 0 to 12 carbon atoms and $R_2$ represents an alkyl or aryl, said $R_2$ having 0 to 12 carbon atoms.

2. The epoxy resin composition according to claim 1:

wherein said alicyclic epoxy resin is a resin selected from the group consisting of an epoxidated cyclohexene derivative, a hydrated bisphenol A diglycidyl ether and a diglycidyl hexahydrophthalate ester.

3. The epoxy resin composition according to claim 1:

wherein said cation curing agent is one selected from the group consisting of an aromatic sulfonium salt, an aromatic diazonium salt, an aromatic iodonium salt and an aromatic selenium salt.

4. The epoxy resin composition according to claim 1 further comprising:

a polyhydric alcohol or a polycondensate thereof in the amount of 0.1 to 5.0 equivalents based on the acid anhydride or dicarboxylic acid.

5. The epoxy resin composition according to claim 4:

wherein said polyhydric alcohol is one selected from the group consisting of an ethylene glycol, a diethylene glycol, a trimethylene glycol, a triethylene glycol, a propylene glycol, a 1,4-butanediol, and a 1,6-hexanediol.

6. A method for producing the epoxy resin composition according to claim 1 comprising:

reacting said epoxy resin and said acid anhydride or dicarboxylic acid to obtain a crosslinked oligomer, mixing of said cross linked oligomer and said cation curing agent.

7. An optical semiconductor device comprising:

at least a pair of lead electrodes, an optical semiconductor chip that is electrically connected to said lead electrodes, and a molding resin that seals said optical semiconductor chip, wherein the molding resin comprises said epoxy resin composition according to claim 1.

8. The optical semiconductor device according to claim 7, wherein said optical semiconductor chip is mounted on a surface of a substrate having said lead electrodes formed thereon.

9. The optical semiconductor device according to claim 7:

wherein said optical semiconductor chip is a light emitting diode chip having a light emitting layer made of a nitride semiconductor that includes at least in and Ga and a main peak of emission at a wavelength of 550 nm or shorter.

* * * * *